(12) United States Patent
Maebashi et al.

(10) Patent No.: US 8,026,612 B2
(45) Date of Patent: Sep. 27, 2011

(54) SEMICONDUCTOR DEVICE AND METHOD OF MANUFACTURING SEMICONDUCTOR DEVICE

(75) Inventors: Takanori Maebashi, Kisarazu (JP); Nobuaki Miyakawa, Niiza (JP)

(73) Assignee: Honda Motor Co., Ltd., Tokyo (JP)

( * ) Notice: Subject to any disclaimer, the term of this patent is extended or adjusted under 35 U.S.C. 154(b) by 262 days.

(21) Appl. No.: 12/369,490

(22) Filed: Feb. 11, 2009

(65) Prior Publication Data

US 2009/0206477 A1    Aug. 20, 2009

(30) Foreign Application Priority Data

Feb. 15, 2008   (JP) .................................. 2008-035164

(51) Int. Cl.
*H01L 23/48* (2006.01)
*H01L 21/44* (2006.01)

(52) U.S. Cl. ............... 257/777; 257/723; 257/E23.145; 438/109

(58) Field of Classification Search .................. 257/686, 257/777, 723, E23.145; 438/109
See application file for complete search history.

(56) References Cited

U.S. PATENT DOCUMENTS

| | | | |
|---|---|---|---|
| 6,239,495 B1 * | 5/2001 | Sakui et al. ................... | 257/777 |
| 6,495,914 B1 * | 12/2002 | Sekine et al. .................. | 257/723 |
| 6,577,013 B1 * | 6/2003 | Glenn et al. ................... | 257/777 |
| 6,734,568 B2 * | 5/2004 | Matsuo et al. ................. | 257/781 |
| 6,864,172 B2 * | 3/2005 | Noma et al. ................... | 438/674 |
| 6,894,378 B2 * | 5/2005 | Winderl ......................... | 257/686 |
| 7,180,149 B2 * | 2/2007 | Yamamoto et al. ........... | 257/434 |
| 7,781,867 B2 * | 8/2010 | Lee ................................ | 257/618 |
| 2002/0030245 A1 * | 3/2002 | Hanaoka et al. .............. | 257/621 |
| 2005/0017338 A1 * | 1/2005 | Fukazawa ..................... | 257/686 |
| 2006/0131713 A1 * | 6/2006 | Fukazawa ..................... | 257/685 |
| 2008/0032448 A1 * | 2/2008 | Simon et al. .................. | 438/107 |

FOREIGN PATENT DOCUMENTS

| JP | 11-261000 A | 9/1999 |
|---|---|---|
| JP | 2007-059769 A | 3/2007 |

* cited by examiner

*Primary Examiner* — Nitin Parekh
(74) *Attorney, Agent, or Firm* — Birch, Stewart, Kolasch & Birch, LLP

(57) ABSTRACT

A semiconductor device has a plurality of wafers which are laminated to each other, wherein: each wafer comprises an lamination surface to which another wafer is laminated; the lamination surface is provided with an electric signal connecting portion that electrically connects to said another surface so as to form a semiconductor circuit; at least one of the electrical signal connecting portions facing each other is a protruding connection portion that protrudes from the lamination surface; and a reinforcing protruding portion that is insulated from the semiconductor circuit and is provided in an area where the protruding connection portion is not disposed on the lamination surface formed with the protruding connection portion so as to protrude from the lamination surface with a height equal to or larger than that of the protruding connection portion.

19 Claims, 16 Drawing Sheets

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device and a method of manufacturing a semiconductor device. In particular, the invention relates to a semiconductor device in which a plurality of wafers are laminated together and a method of manufacturing a semiconductor device.

Priority is claimed on Japanese Patent Application No. 2008-035164, filed on Feb. 15, 2008, the content of which is incorporated herein by reference.

2. Description of Related Art

A three-dimensional semiconductor integrated circuit device having a configuration in which two or more wafers are laminated and are electrically connected to each other through an embedded wiring line is known in the related art. For example, Japanese Unexamined Patent Application, First Publication No. H11-261000 (hereinafter Patent Document 1) discloses a semiconductor device obtained by the following manufacturing method.

First, a trench (deep groove) is formed in one wafer to be laminated, the inside of the trench is thermally oxidized, and then polysilicon as a conductor is embedded into the trench to form an embedded wiring line. Then, the wafer is made thin until the embedded wiring line is exposed, and a bottom surface bump is formed at the position of a bottom surface of the wafer corresponding to the embedded wiring line. Then, the bottom surface bump of the wafer and a top surface bump formed on a top surface of another wafer to be laminated are laminated and an insulating adhesive is injected between the two laminated wafers, thereby manufacturing a three-dimensional semiconductor integrated circuit device.

In addition, an example of a semiconductor device that forms a desired semiconductor circuit by laminating a plurality of substrates together and electrically connecting semiconductor circuit portions formed on the substrates is disclosed in Japanese Unexamined Patent Application, First Publication No. 2007-59769 (hereinafter Patent Document 2). In the semiconductor device disclosed in the Patent Document 2, a semiconductor circuit portion of an upper substrate and a semiconductor circuit portion of a lower substrate are electrically connected to each other by being laminated in a state where a penetrating wiring portion exposed from a bottom surface of the upper substrate and a bump of a principal surface of the lower substrate are in contact with each other.

However, in the known semiconductor device in which a plurality of wafers are laminated together, the plurality of wafers are electrically connected to each other through an electric signal connecting portion, such as a bump or a penetrating wiring portion protruding from a lamination surface.

For example, in the technique disclosed in the Patent Document 1, the wafer disposed at the upper side and the wafer disposed at the lower side are electrically connected to each other through the bump formed to protrude from the wafer surface. In addition, in the technique disclosed in the Patent Document 2, the upper substrate and the lower substrate are electrically connected to each other through the penetrating wiring portion protruding from the bottom surface of the upper substrate and the bump protruding from the principal surface of the lower substrate.

When electrically connecting the plurality of wafers through the electric signal connecting portion protruding from the lamination surface as described above, the electric signal connecting portion was often damaged in laminating the wafers together. If the electric signal connecting portion is damaged, the electrical stability or reliability in the electric signal connecting portion becomes insufficient or the mechanical characteristics of the semiconductor device become unstable. Accordingly, there was a possibility that a semiconductor device with stable performance could not be obtained.

In view of the above situation, it is an object of the invention to provide a semiconductor device which is able to effectively prevent damage occurring in an electric signal connecting portion protruding from a lamination surface in laminating a plurality of wafers together and which has excellent reliability and stable performance.

In addition, it is another object of the invention to provide a method of manufacturing a semiconductor device which is able to effectively prevent damage occurring in an electric signal connecting portion protruding from a lamination surface in laminating a plurality of wafers together and which has excellent reliability and stable performance.

SUMMARY OF THE INVENTION

In order to achieve the above objects, the inventors examined the cause of damage to an electric signal connecting portion (hereinafter, also referred to as a "protruding connection portion") protruding from a lamination surface. As a result, it was found that the damage to the protruding connection portion occurred because an excessive load was applied to some protruding connection portions by a variation in load applied in laminating a plurality of wafers together. Then, the inventors completed a semiconductor device and a method of manufacturing a semiconductor device capable of reducing the variation in load applied to the protruding connection portion and of effectively reinforcing the protruding connection portion.

According to the present invention, a semiconductor device has a plurality of wafers which are laminated to each other, wherein: each wafer comprises an lamination surface to which another wafer is laminated; the lamination surface is provided with an electric signal connecting portion that electrically connects to said another surface so as to form a semiconductor circuit; at least one of the electrical signal connecting portions facing each other is a protruding connection portion that protrudes from the lamination surface; and a reinforcing protruding portion that is insulated from the semiconductor circuit and is provided in an area where the protruding connection portion is not disposed on the lamination surface formed with the protruding connection portion so as to protrude from the lamination surface with a height equal to or larger than that of the protruding connection portion.

Moreover, the inventors examined the type of a particular arrangement of protruding connection portions, which are easily damaged, noting the relationship between the arrangement of protruding connection portions on a lamination surface and damage to the protruding connection. As a result, it was found that damage easily occurred particularly in the arrangements of protruding connection portions shown in the following (1) to (3). FIGS. 1A to 1D are plan views illustrating examples of the arrangement of protruding connection portions in a lamination surface and in particular, views illustrating the arrangements of protruding connection portions which are easily damaged.

(1) As shown in FIG. 1A, one isolated protruding connection portion 51a without another protruding connection portion 51a disposed therearound or in the vicinity thereof even though there is a space where another protruding connection portion 51a can be disposed around or in the vicinity of the isolated protruding connection portion 51a.

(2) As shown in FIGS. 1B and 1C, in the case where a protruding connection portion group 51d in which a plurality of protruding connection portions 51b are disposed adjacent to each other is formed, protruding connection portions disposed at an outermost periphery portion of a protruding connection portion group 51d when another protruding connection portion 51b is not disposed around or in the vicinity of the protruding connection portion group 51d even though there is a space where another protruding connection portion 51b can be disposed around or in the vicinity of the protruding connection portion group 51d. In particular, four protruding connection portions 51c disposed at the corners of the protruding connection portion group 51d when the protruding connection portion group 51d has a rectangular shape as shown in FIGS. 1B and 1C.

(3) As shown in FIG. 1D, in the case where two or more protruding connection portion groups 51d, in which the plurality of protruding connection portions 51b are disposed adjacent to each other, are formed to thereby form a protruding connection portion collection 51f including two or more (two in the example shown in FIG. 1D) protruding connection portion groups 51d adjacent to each other, protruding connection portions disposed at an outermost periphery portion of the protruding connection portion collection 51f when another protruding connection portion 51b is not disposed around or in the vicinity of the protruding connection portion collection 51f even though there is a space where another protruding connection portion 51b can be disposed around or in the vicinity of the protruding connection portion collection 51f. In particular, four protruding connection portions 51g disposed at the corners of the protruding connection portion collection 51f when the protruding connection portion collection 51f has a rectangular shape. Moreover, in the protruding connection portion collection 51f, a protruding connection portion 51e, which is disposed at another adjacent protruding connection portion group 51d, among the protruding connection portions disposed at the corners of the protruding connection portion group 51d has another protruding connection portion disposed in the vicinity. Accordingly, it is difficult for damage to occur.

Furthermore, the inventors made a semiconductor device capable of effectively reinforcing the protruding connection portions in the particular arrangements shown in (1) to (3), which are easily damaged, by using the arrangements of reinforcing protruding portions shown in the following (I) to (III). FIGS. 2A to 2D are plan views schematically illustrating only a reinforcing protruding portion and a protruding connection portion in a state where a part of the semiconductor device of the invention is enlarged, which are plan views illustrating examples of the arrangement of the reinforcing protruding portion and the protruding connection portion in a lamination surface. In addition, the arrangements of protruding connection portions shown in FIGS. 2A to 2D are the same as those shown in FIGS. 1A to 1D.

In the semiconductor device of the present invention, (I) a plurality of the reinforcing protruding portions may be disposed on each wafer so as to surround the one protruding connection portion, as shown in FIG. 2A.

Furthermore, in the semiconductor device of the invention, (II) the plurality of protruding connection portions may be disposed adjacent to each other to thereby form a protruding connection portion group, and a plurality of the reinforcing protruding portions may be disposed so as to surround the protruding connection portion group, as shown in FIGS. 2B and 2C.

In the semiconductor device of the invention, (III) the plurality of protruding connection portions may be disposed adjacent to each other to thereby form two or more protruding connection portion groups, and a plurality of the reinforcing protruding portions may be disposed so as to surround the two or more protruding connection portion groups formed adjacent to each other, as shown in FIG. 2D.

The reinforcing protruding portion may be formed to have the same shape as the protruding connection portion using the same material as the protruding connection portion.

At least one of the electric signal connecting portions may be an end of a penetrating wiring portion which makes one and the other surfaces of the wafer electrically conductive.

At least one of the protruding connection portions may be a bump.

A penetrating separation portion that is formed of an insulating layer with a frame shape in plan view of the lamination surface and surrounds the protruding connection portion may be provided on each wafer, and the reinforcing protruding portion may be formed of the same material as the penetrating separation portion.

According to the present invention, a method of manufacturing a semiconductor device includes: forming the protruding connection portion which protrudes from the lamination surface of at least one of the plurality of wafers; forming a reinforcing protruding portion, which is insulated from the semiconductor circuit and protrudes from the lamination surface with a height equal to or larger than that of the protruding connection portion, in an area where the protruding connection portion is not disposed on the lamination surface formed with the protruding connection portion; and forming the semiconductor circuit by laminating the plurality of wafers together and electrically connecting the protruding connection portion of each wafer with an electric signal connecting portion, which is provided on a lamination surface of another wafer facing each wafer so as to face the protruding connection portion.

The forming of the protruding connection portion and the forming of the reinforcing protruding portion may be simultaneously performed.

The forming of the protruding connection portion and the forming of the reinforcing protruding portion may include: forming conductive portions, which become the protruding connection portion and the reinforcing protruding portion, by forming a groove in one surface of the wafer and embedding a conductive layer in the groove; forming an insulating layer for insulating a conductive portion which becomes the reinforcing protruding portion on the one surface; forming a wiring line electrically connected to a conductive portion which becomes the protruding connection portion; and forming the protruding connection portion and the reinforcing protruding portion protruding from the lamination surface by exposing a part of the conductive portions, which become the protruding connection portion and the reinforcing protruding portion, from the other surface of the wafer.

In addition, in the method of manufacturing a semiconductor device, the forming of the protruding connection portion and the forming of the reinforcing protruding portion may include: forming a frame-shaped penetrating separation portion, which surrounds the protruding connection portion with a gap therebetween in plan view, and a frame-shaped dummy penetrating separation portion, which surrounds the reinforcing protruding portion with a gap therebetween in plan view, by forming a groove in one surface of the wafer and embedding an insulating layer in the groove; forming conductive portions, which are the protruding connection portion and the reinforcing protruding portion, by forming a groove in one surface of the wafer and embedding a conductive layer in the groove; forming, in the one surface, an insulating layer for insulating a conductive portion, which is the reinforcing protruding portion, and a wiring line electrically connected to a conductive portion which is the protruding connection portion; and forming the protruding connection portion, the reinforcing protruding portion, the penetrating separation portion and the dummy penetrating separation portion which functions as the reinforcing protruding portion, by exposing parts of conductive portions, which are the protruding connection portion and the reinforcing protruding portion, from the other surface of the wafer and exposing parts of the penetrating separation portion and the dummy penetrating separation portion.

In addition, in the method of manufacturing a semiconductor device, the forming of the reinforcing protruding portion may include: forming a frame-shaped penetrating separation portion, which surrounds the protruding connection portion with a gap therebetween in plan view, and a frame-shaped dummy penetrating separation portion by forming a groove in one surface of the wafer and embedding an insulating layer in the groove; and forming the penetrating separation portion and the dummy penetrating separation portion which functions as the reinforcing protruding portion protruding from the lamination surface, by exposing parts of the penetrating separation portion and the dummy penetrating separation portion from the other surface of the wafer.

The forming of the protruding connection portion and the forming of the reinforcing protruding portion may include: forming a bump which is the protruding connection portion on a wiring line exposed on the lamination surface, and forming a dummy bump which is the reinforcing protruding portion in an area where the wiring line is not disposed on the lamination surface.

In the semiconductor device of the present invention, at least one of the electric signal connecting portions facing each other is a protruding connection portion formed to protrude from the lamination surface and the reinforcing protruding portion, which is insulated from the semiconductor circuit and protrudes from the lamination surface with a height equal to or larger than that of the protruding connection portion, is formed in an area where the electric signal connecting portion is not disposed on the lamination surface formed with the protruding connection portion. Accordingly, since the load applied to the protruding connection portion is also applied to the reinforcing protruding portion when laminating the plurality of wafers together, a variation in load applied to the protruding connection portion is reduced. As a result, damage to the protruding connection portion occurring when laminating a plurality of wafers together can be effectively prevented. As a result, the semiconductor device of the invention has excellent reliability and stable performance. In addition, since the reinforcing protruding portion is insulated from the semiconductor circuit, the reinforcing protruding portion does not have an effect on the semiconductor circuit which forms the semiconductor device.

In addition, the method of manufacturing a semiconductor device of the invention includes: forming a protruding connection portion protruding from a lamination surface on the lamination surface of at least one of a plurality of wafers; forming a reinforcing protruding portion, which is insulated from the semiconductor circuit and which protrudes from the lamination surface with a height equal to or larger than that of the protruding connection portion, in an area where the electric signal connecting portion is not disposed on the lamination surface formed with the protruding connection portion; and forming a desired semiconductor circuit by laminating the plurality of wafers together and electrically connecting the electric signal connecting portions of the wafers with each other. Accordingly, even if the load is applied to the protruding connection portion when laminating the plurality of wafers together, the variation in load applied to the protruding connection portion is reduced since the load applied to the protruding connection portion is also applied to the reinforcing protruding portion. Therefore, according to the method of manufacturing a semiconductor device of the invention, a semiconductor device which is able to effectively prevent damage occurring in the protruding connection portion in laminating a plurality of wafers together and which has excellent reliability and stable performance can be obtained.

DETAILED DESCRIPTION OF THE INVENTION

Hereinafter, the invention will be described in detail with reference to the accompanying drawings.

Figure 18:
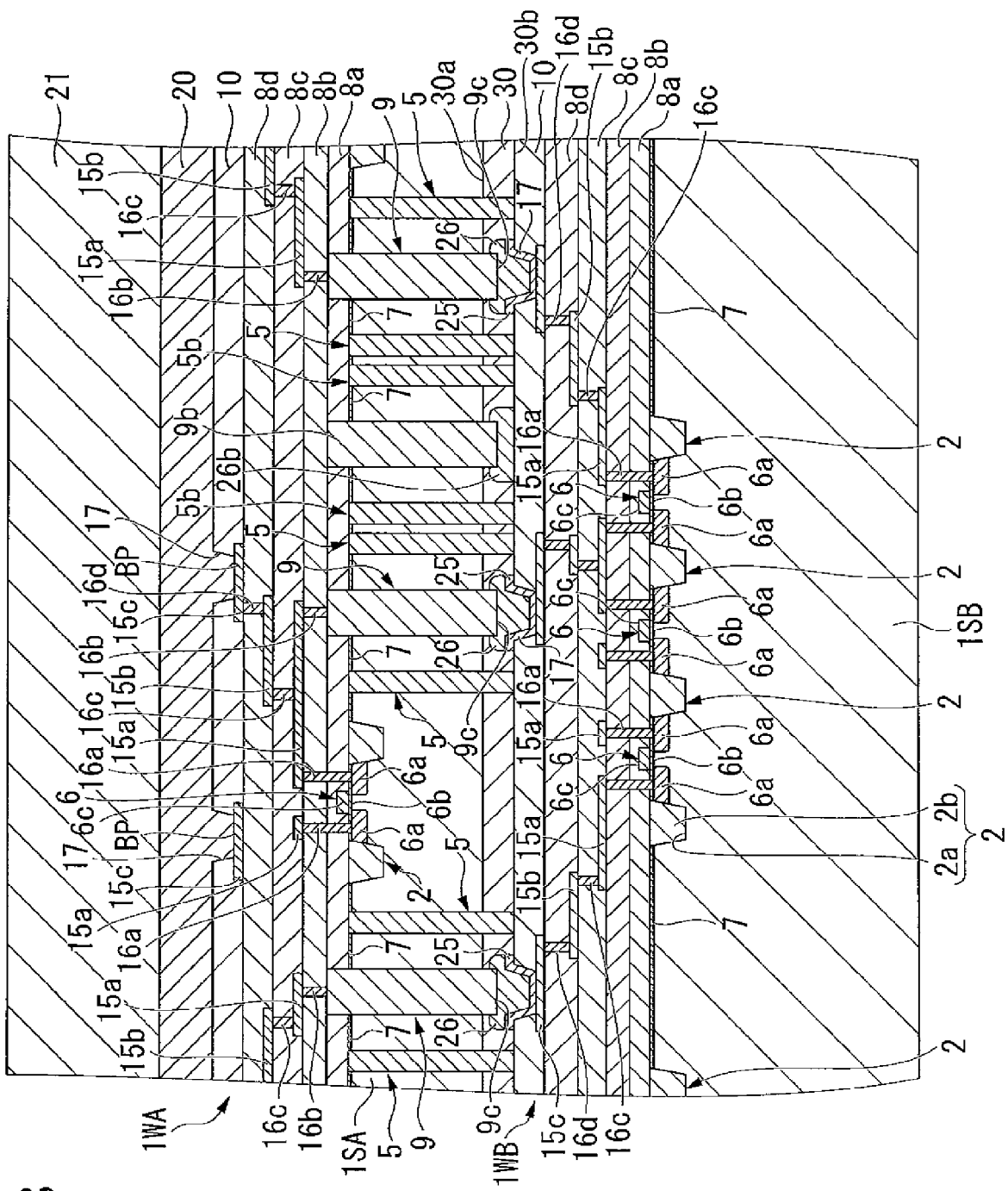
FIG. 18 is a cross-sectional view illustrating the main parts in the process of laminating upper and lower wafers together subsequent to FIG. 17.
Figure 19:
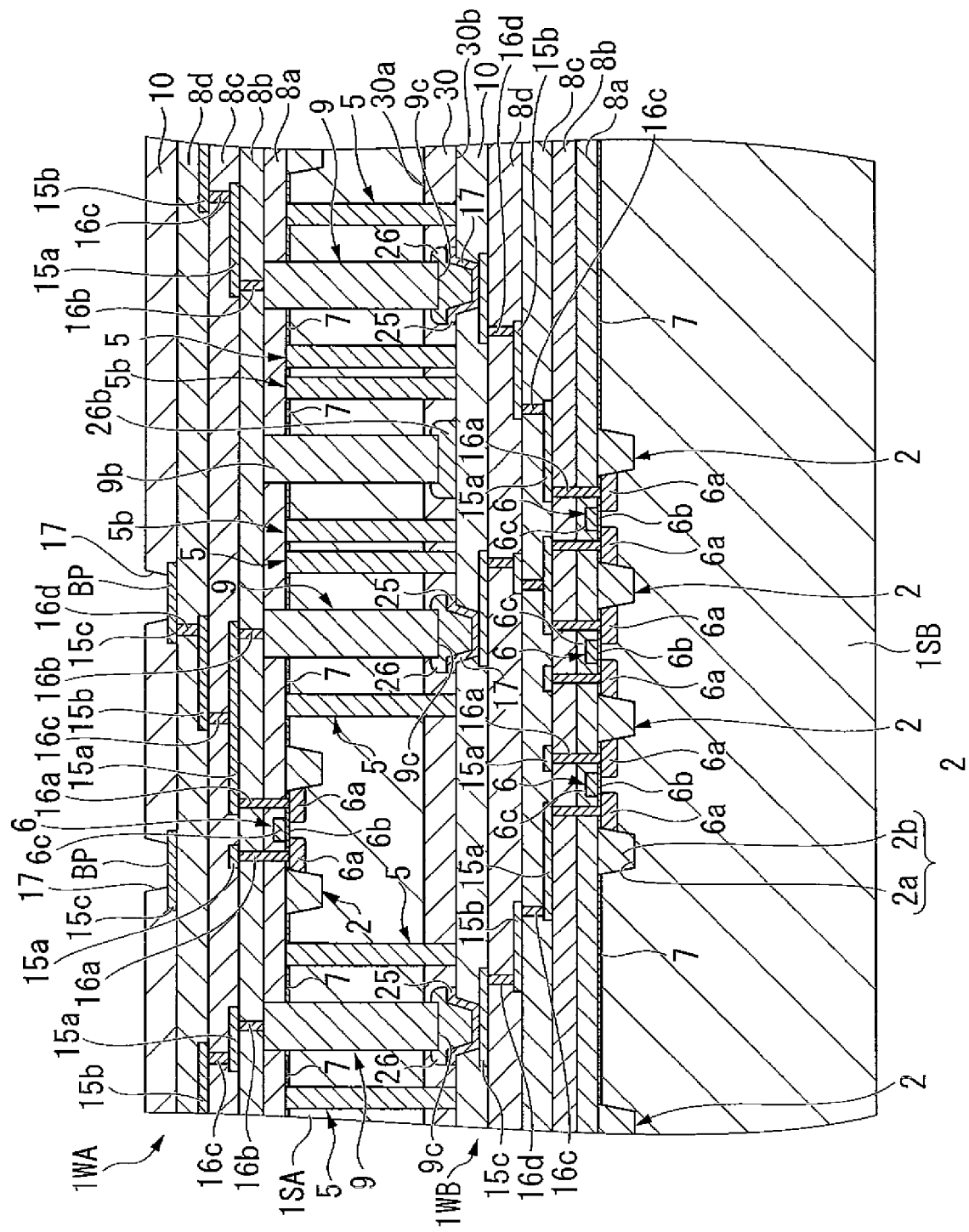
FIG. 19 is a cross-sectional view illustrating the main parts in an example of a semiconductor device of the invention.
Figure 20:
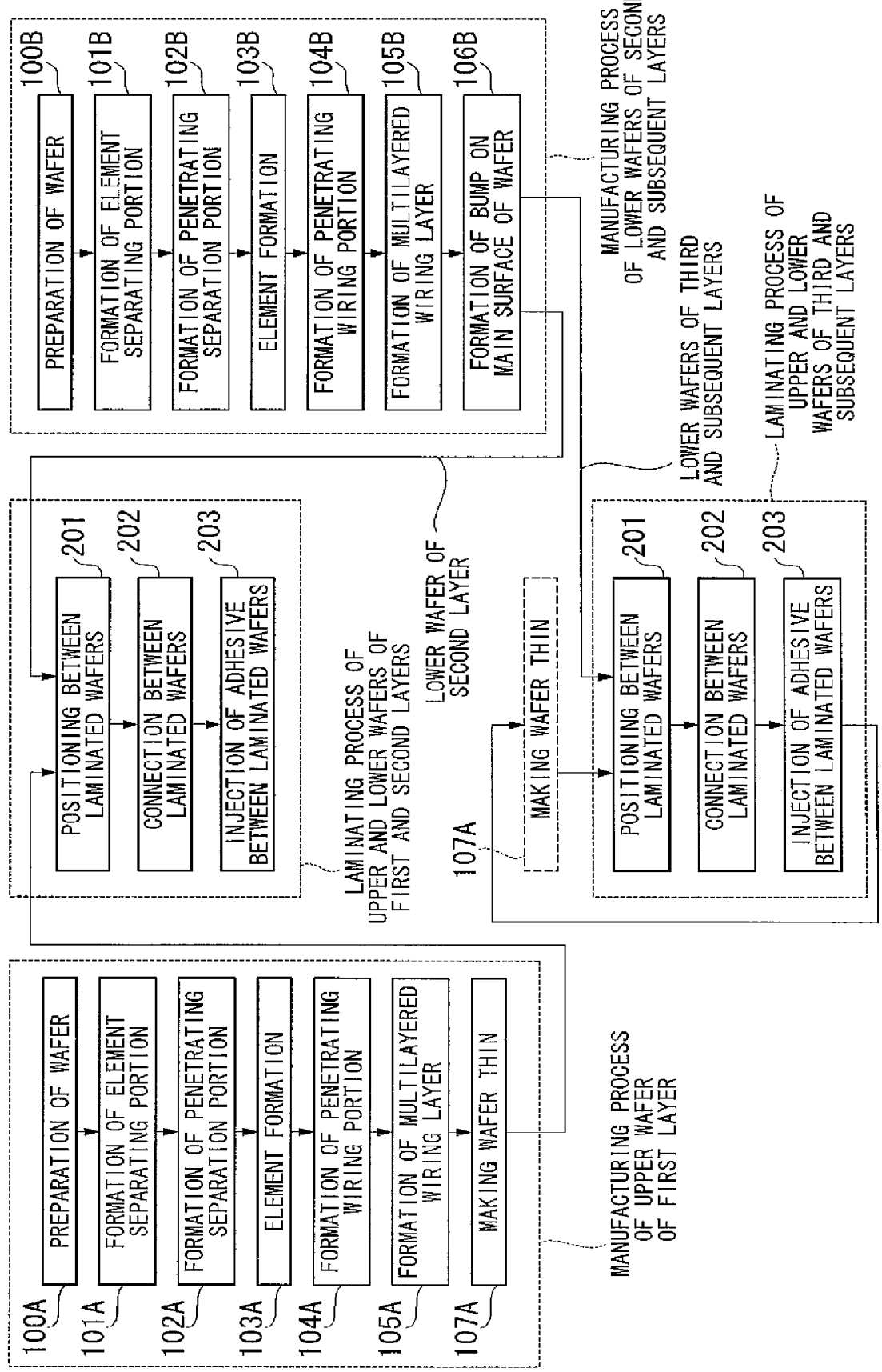
FIG. 20 is a flow chart illustrating a manufacturing process of the semiconductor device shown in FIG. 19.

FIGS. 3 to 20 are views illustrating a semiconductor device and a method of manufacturing a semiconductor device of the invention. FIG. 19 is a cross-sectional view illustrating the main parts in an example of the semiconductor device of the invention. FIGS. 3 to 18 are views illustrating a manufacturing process of the semiconductor device shown in FIG. 19. FIG. 20 is a flow chart illustrating the manufacturing process of the semiconductor device shown in FIG. 19.

The semiconductor device according to the present embodiment shown in FIG. 19 has an upper wafer 1WA and a lower wafer 1WB laminated to each other. An electric signal connecting portion formed by a penetrating wiring portion 9 is provided on a lamination surface 30a of the upper wafer 1WA facing the lower wafer 1WB. The penetrating wiring portion 9 is formed to pass through a substrate 1SA that forms the upper wafer 1WA and serves to make a main surface (one surface) and a bottom surface (the other surface) of the upper wafer 1WA electrically conductive. In addition, an electric signal connecting portion formed by a bump 26 is provided on a lamination surface 30b of the lower wafer 1WB facing the upper wafer 1WA. In addition in the semiconductor device shown in FIG. 19, a desired semiconductor circuit having MOSFETs 6 provided in the substrates 1SA and 1SB that form the wafers 1WA and 1WB, respectively, is formed by electrically connecting an end 9c of the penetrating wiring portion 9 of the upper wafer 1WA with the bump 26 of the lower wafer 1WB, the upper wafer 1WA and the lower wafer 1WB being disposed to face each other.

In addition, as shown in FIG. 19, an insulating adhesive 30 is injected between the lamination surfaces 30a and 30b of the upper and lower wafers 1WA and 1WB. By the adhesive 30, the mechanical strength between the upper and lower wafers 1WA and 1WB is secured. In addition, although the case where the adhesive 30 is injected into the inside of a frame of a penetrating separation portion 5 is illustrated in the present embodiment, the adhesive 30 does not have an effect on the characteristics of the semiconductor circuit because the insulating adhesive 30 is used as an adhesive.

In addition, in the semiconductor device shown in FIG. 19, the penetrating wiring portion 9 of the upper wafer 1WA which is an electric signal connecting portion is a protruding connection portion having the end 9c formed to protrude from the lamination surface 30a. In addition, the bump 26 of the lower wafer 1WB which is an electric signal connecting portion is also a protruding connection portion formed to protrude from the lamination surface 30b.

In an area where the penetrating wiring portion 9 is not disposed on the lamination surface 30a of the upper wafer 1WA formed with the penetrating wiring portion 9, a dummy penetrating wiring portion 9b serving as a reinforcing protruding portion that is insulated from the semiconductor circuit and protrudes from the lamination surface 30a to have the same height as the end 9c of the penetrating wiring portion 9 is formed. In the semiconductor device shown in FIG. 19, the dummy penetrating wiring portion 9b and the penetrating wiring portion 9 which is a protruding connection portion are formed to have the same shape using the same material. Each of the penetrating wiring portion 9 and the dummy penetrating wiring portion 9b is formed to include a main conductor layer formed of tungsten, for example, and a barrier conductor layer that is thinner than the main conductor layer, covers side and bottom surfaces of the main conductor layer, and is formed of titanium nitride, for example. In addition, as shown in FIG. 19, the penetrating wiring portion 9 and the dummy penetrating wiring portion 9b are formed to pass through the substrate 1SA. The penetrating wiring portion 9 is electrically connected to a laminating pad BP through wiring lines 15a, 15b, and 15c, as shown in FIG. 19. In addition, the penetrating wiring portion 9 is electrically insulated from the substrate 1SA by the penetrating separation portion 5 and the adhesive 30. In addition, the dummy penetrating wiring portion 9b is insulated by interlayer insulating layers (insulating layer) 8b, 8c, and 8d, the penetrating separation portion 5, the adhesive 30, and the like so that the dummy penetrating wiring portion 9b is not electrically connected to the wiring lines 15a, 15b, and 15c, the MOSFET 6, the penetrating wiring portion 9, and the bump 26 that form the semiconductor circuit.

Moreover, in the semiconductor device shown in FIG. 19, a dummy bump 26b serving as a reinforcing protruding portion that protrudes from the lamination surface 30b to have the same height as the bump 26 is formed in an area where the bump 26 is not disposed on the lamination surface 30b of the lower wafer 1WB formed with the bump 26. In the semiconductor device shown in FIG. 19, the dummy bump 26b is formed to have the same shape as the bump 26, which is a protruding connection portion, using the same material as the bump 26. The bump 26 and the dummy bump 26b are formed of a conductive material, such as copper. The bump 26 is electrically connected to the uppermost wiring layer 15c of the lower wafer 1WB, as shown in FIG. 19. In addition, the dummy bump 26b is insulated by interlayer insulating layers (insulating layer) 8a, 8b, 8c, and 8d, the penetrating separation portion 5, the adhesive 30, and the like so that the dummy bump 26b is not electrically connected to the wiring lines 15a, 15b, and 15c, the MOSFET 6, the penetrating wiring portion 9, and the bump 26 that form the semiconductor circuit, as shown in FIG. 19.

In the present embodiment, although the planar arrangement of the dummy penetrating wiring portion 9b and the dummy bump 26b, which are reinforcing protruding portions, and the penetrating wiring portion 9 and the bump 26, which are protruding connection portions, is not particularly limited, the same arrangement as a reinforcing protruding portion 52 and a protruding connection portion 51a shown in FIGS. 2A to 2D, for example, is preferable to effectively prevent the penetrating wiring portion 9 and the bump 26 from being damaged.

Figure 1A:
FIGS. 1A to 1D are plan views illustrating examples of the arrangement of protruding connection portions in a lamination surface and in particular, views illustrating the arrangements of protruding connection portions which are easily damaged.
Figure 1B:
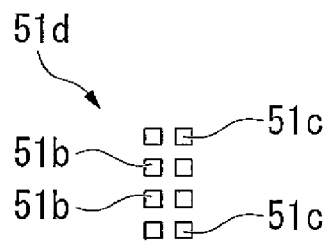
Figure 1C:
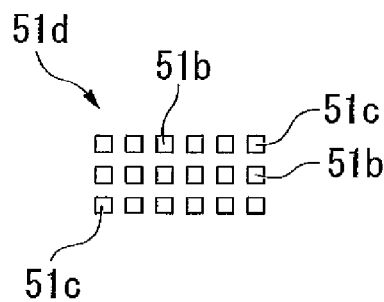
Figure 1D:
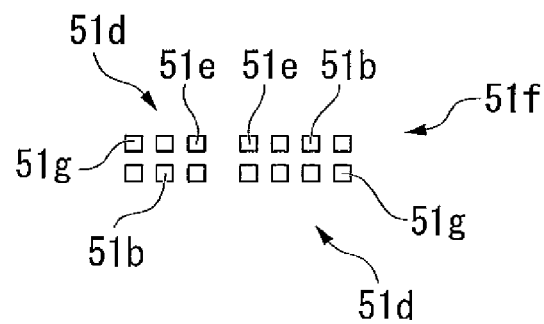
Figure 2A:
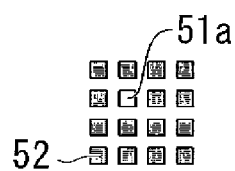
FIGS. 2A to 2D are plan views schematically illustrating only a reinforcing protruding portion and a protruding connection portion in a state where a part of the semiconductor device of the invention is enlarged, which are plan views illustrating examples of the arrangement of the reinforcing protruding portion and the protruding connection portion in a lamination surface.

For example, when the protruding connection portion 51a is one isolated protruding connection portion 51a without another protruding connection portion 51a disposed therearound or in the vicinity thereof even though there is a space where another protruding connection portion 51a can be disposed as shown in FIG. 2A, it is preferable to dispose the reinforcing protruding portion 52 to surround the one protruding connection portion 51a.

Figure 2B:
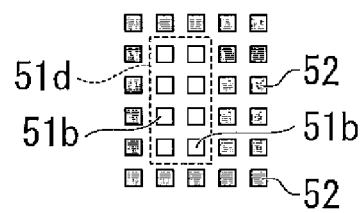
Figure 2C:
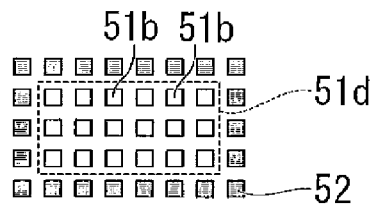

In addition, as shown in FIGS. 2B and 2C, when a protruding connection portion group 51d, in which a plurality of protruding connection portions 51b are disposed adjacent to each other, is formed and another protruding connection portion 51b is not disposed around or in the vicinity of the protruding connection portion group 51d even though there is a space around or in the vicinity of the protruding connection portion group 51d where another protruding connection portion 51b can be disposed, it is preferable to dispose the plurality of reinforcing protruding portions 52 to surround the protruding connection portion group 51d.

Figure 2D:
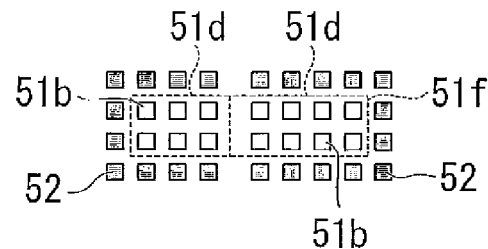

In addition, as shown in FIG. 2D, when two or more protruding connection portion groups 51d, in which the plurality of protruding connection portions 51b are disposed adjacent to each other, are formed and a protruding connection portion collection 51f including two or more protruding connection portion groups 51d adjacent to each other is formed even though there is a space around or in the vicinity of the protruding connection portion collection 51f where another protruding connection portion 51b can be disposed, it is preferable to dispose the plurality of reinforcing protruding portions 52 to surround the protruding connection portion collection 51f.

In addition, the reinforcing protruding portions 52 shown in FIGS. 2A to 2D may be disposed two or three times to surround the protruding connection portion 51a, the protruding connection portion group 51d, or the protruding connection portion collection 51f or may be disposed singly as shown in FIGS. 2C and 2D. Alternatively, only some of the reinforcing protruding portions 52 may be disposed two or three times as shown in FIGS. 2A and 2B, or may be determined according to the arrangement of protruding connection portions, the size of the space where the reinforcing protruding portions 52 can be disposed, and the like. In addition, when only some of the reinforcing protruding portions 52 are disposed two or three times as shown in FIGS. 2A and 2B, the reinforcing protruding portions 52 are preferably disposed such that the arrangement of the reinforcing protruding portions 52 disposed at the outermost periphery portion has a shape close to a square in order to effectively reduce the variation in load applied to the protruding connection portion.

In addition, in the semiconductor device shown in FIG. 19, the upper wafer 1WA is a thin plate having an approximately circular shape in plan view, for example. The substrate 1SA that forms the upper wafer 1WA is formed of, for example, n-type or p-type silicon (Si) single crystal and has main and bottom surfaces, which are opposite sides in the thickness direction. A grooved separating portion 2 for element separation is formed on the main surface (that is, the main surface of the wafer 1WA) of the substrate 1SA. The grooved separating portion 2 is formed by embedding an insulating layer 2b, such as a silicon oxide (SiO$_2$). An active region of the main surface of the substrate 1SA is set by the separating portion 2.

Figure 9:
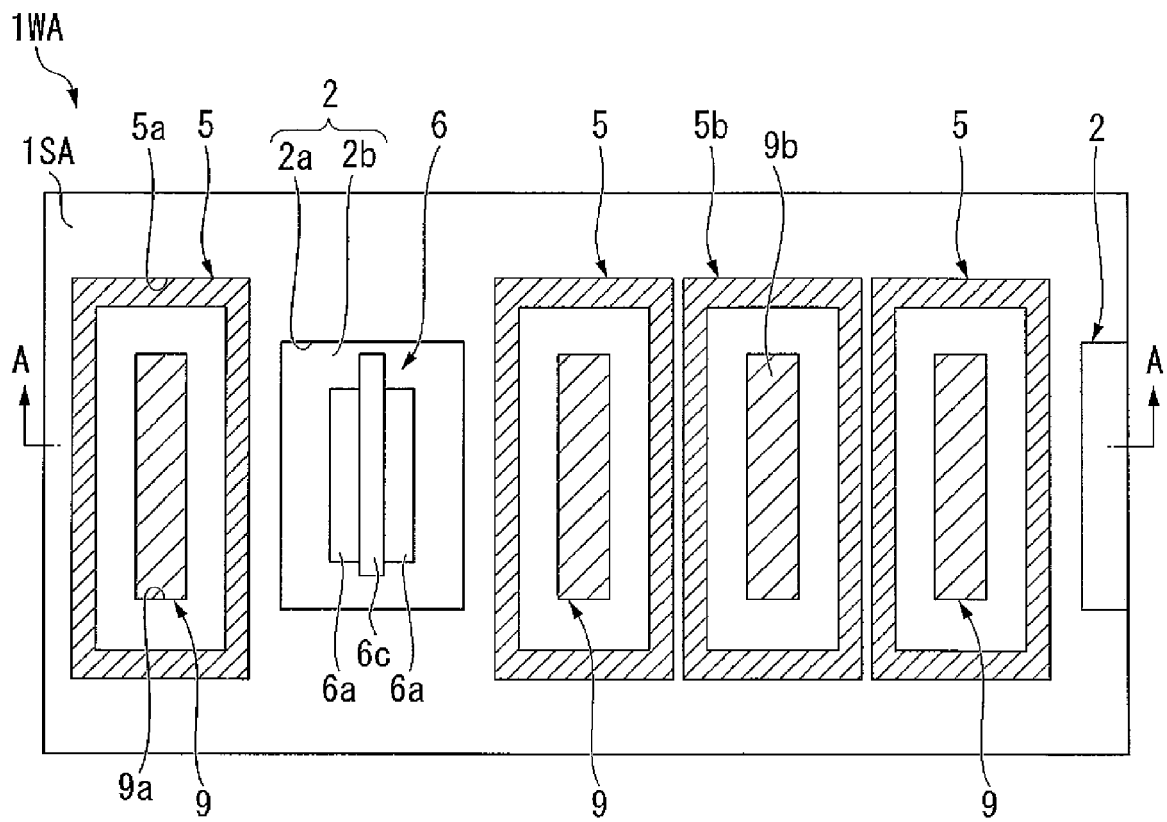
FIG. 9 is a plan view illustrating the main parts in a manufacturing process of the upper wafer subsequent to FIG. 8.

In addition, reference numeral 5 in the semiconductor device shown in FIG. 19 denotes a penetrating separation portion formed of an insulating layer passing through the substrate 1SA. As shown in FIG. 9, the penetrating separation portion 5 is formed in the shape of a frame in plan view, and has a shape surrounding each penetrating wiring portion 9 individually on the lamination surface 30a. As shown in FIG. 19, the height of the penetrating separation portion 5 protruding from the lamination surface 30a is the same as the size of a gap between the wafers 1WA and 1WB laminated to each other.

In addition, reference numeral 5b in the semiconductor device shown in FIG. 19 denotes a dummy penetrating separation portion 5b which is formed of an insulating layer, which is the same material as the penetrating separation portion 5, so as to be insulated from the semiconductor device and which functions as a reinforcing protruding portion protruding from the lamination surface 30a to be higher than the penetrating wiring portion 9 and the dummy penetrating wiring portion 9b. The dummy penetrating separation portion 5b is formed in an area where the penetrating wiring portion 9 and the dummy penetrating wiring portion 9b are not disposed on the lamination surface 30a and has the same cross-sectional shape as the penetrating separation portion 5 as shown in FIG. 19. In addition, as shown in FIG. 9, the dummy penetrating separation portion 5b has a frame shape in plan view, and has a shape surrounding each dummy penetrating wiring portion 9b individually. Furthermore, similar to the penetrating separation portion 5, the height of the dummy penetrating separation portion 5b protruding from the lamination surface 30a is the same as the size of the gap between the wafers 1WA and 1WB laminated to each other, as shown in FIG. 19.

Furthermore, an element used to form a semiconductor device, such as the MOSFET (metal oxide semiconductor field effect transistor) 6, is formed in the active region surrounded by the grooved separating portion 2. The MOSFET 6 has a semiconductor region 6a for source and drain, a gate insulating layer 6b, and a gate electrode 6c. The semiconductor region 6a for source and drain is formed by adding desired impurities (for example, phosphorus (P) or arsenic (As) in the case of an n-channel MOSFET 6, and boron (B) in the case of a p-channel MOSFET 6) in the substrate 1SA. The gate insulating layer 6b is formed of a silicon oxide, for example, and is formed on the main surface of the substrate 1SA. The gate electrode 6c is formed of, for example, polysilicon with low resistance and is formed on the gate insulating layer 6b. In addition, an insulating layer 7 on the main surface of the active region of the substrate 1SA is an insulating layer formed of a silicon oxide, for example.

In addition, instead of the MOSFET 6 shown in FIG. 19, other active elements, such as a bipolar transistor and a diode, may also be formed. Alternatively, passive elements, such as a resistor (a diffused resistor or a polysilicon resistor), a capacitor, and an inductor, may also be formed instead of the MOSFET 6.

Moreover, in FIG. 19, reference numerals 8a, 8b, 8c, and 8d denote interlayer insulating layers, reference numeral 10 denotes a passivation layer, reference numerals 15a, 15b, and 15c denote wiring lines, and reference numerals 16a, 16b, 16c, and 16d denote plugs. The interlayer insulating layers 8a, 8b, 8c, and 8d are formed of a silicon oxide, for example. The wiring lines 15a to 15c and the plugs 16a to 16d are formed of metal, such as tungsten (W), aluminum (Al), or copper (Cu). The wiring line 15a of a first layer is electrically connected to the gate electrode 6c and the semiconductor region 6a for source and drain of the MOSFET 6 through the plug 16a, and is also electrically connected to the penetrating wiring portion 9 through the plug 16b. The passivation layer 10 is formed, for example, by a single layer of a silicon oxide or by a laminated layer including a silicon oxide layer and a silicon nitride layer deposited on the silicon oxide layer. An opening 17 from which a part of the wiring line 15c of a third layer is exposed is formed in a part of the passivation layer 10. In addition, a part of the wiring line 15c exposed from the opening 17 in plan view is the laminating pad (hereinafter, referred to as a pad) BP. In addition, although not shown in FIG. 19, a bump may be formed to be connected to the pad BP on the main surface of the wafer 1WA.

Furthermore, in the semiconductor device shown in FIG. 19, the configuration of the lower wafer 1WB is almost the same as that of the upper wafer 1WA, but the penetrating separation portion 5, the dummy penetrating separation portion 5b, the penetrating wiring portion 9, and the dummy penetrating wiring portion 9b are not formed in the lower wafer 1WB. In addition, unlike the upper wafer 1WA, a bump base conductor pattern 25 electrically connected to the pad BP through the opening 17 is formed on the opening 17 formed on the main surface of the lower wafer 1WB. In addition, a bump 26 is formed on the bump base conductor pattern 25 so as to protrude therefrom. In addition, unlike the upper wafer 1WA, the dummy bump 26b is formed in an area where the bump 26 is not disposed on the main surface (lamination surface 30b) of the lower wafer 1WB.

Next, a manufacturing process of the semiconductor device shown in FIG. 19 will be described with reference to FIG. 20.

Figure 3:
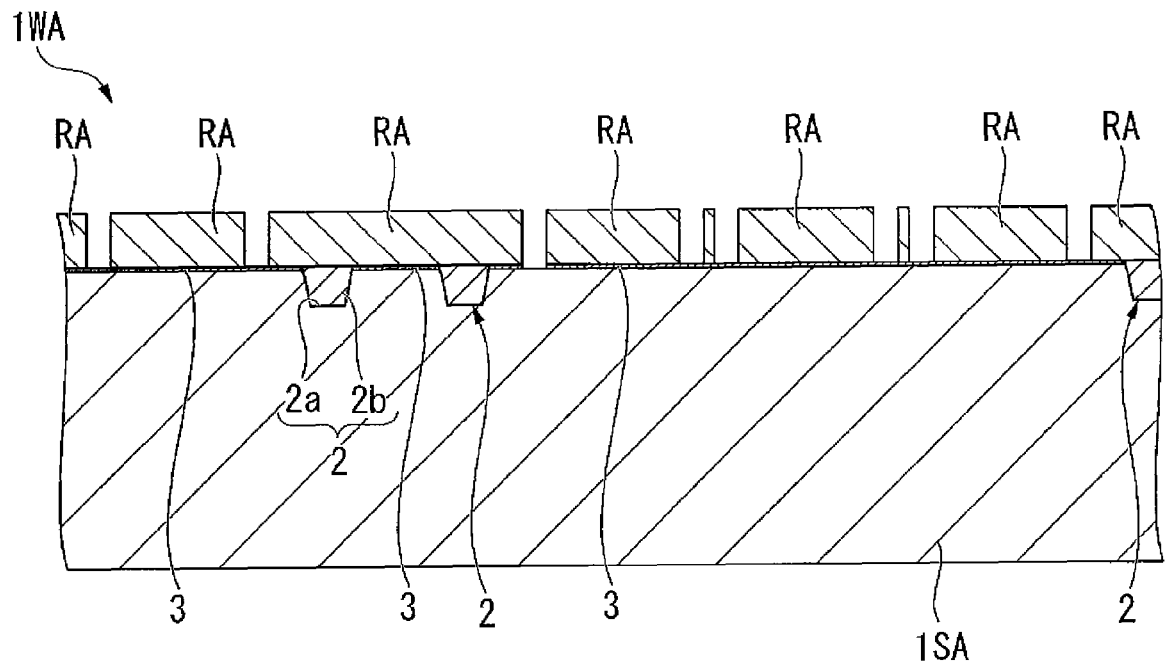
FIG. 3 is a cross-sectional view illustrating the main parts in a manufacturing process of an upper wafer.

A manufacturing process (manufacturing process of an upper wafer of a first layer in FIG. 20) of an upper wafer will be described first. The upper wafer 1WA is prepared (process 100A in FIG. 20). Then, as shown in FIG. 3, the grooved separating portion 2 for element separation is formed on the main surface (that is, the main surface of the wafer 1WA) of the substrate 1SA (process 101A in FIG. 20). The separating portion 2 is formed by forming a separation groove 2a on the main surface of the substrate 1SA and then embedding the insulating layer 2b, such as a silicon oxide ($SiO_2$), in the separation groove 2a. In addition, an insulating layer 3 formed of a silicon oxide, for example, is formed on the main surface of the active region of the substrate 1SA using a thermal oxidation method or the like.

Then, the penetrating separation portion 5 and the dummy penetrating separation portion 5b are simultaneously formed on the substrate 1SA. First, as shown in FIG. 3, a resist pattern RA is formed on the main surface of the substrate 1SA by coating a resist film on the main surface of the substrate 1SA using a spin coating method, for example, and performing exposure and development (series of processing including such resist coating, exposure, and development are called a lithographic processing).

Figure 4:
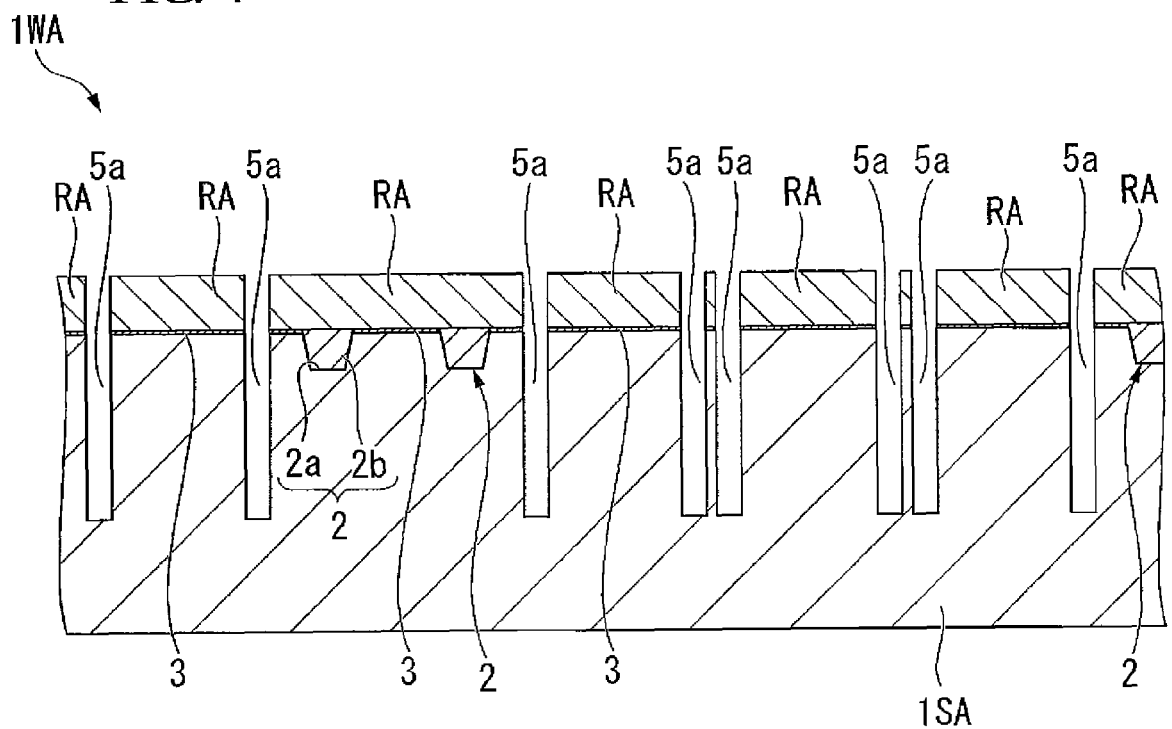
FIG. 4 is a cross-sectional view illustrating the main parts in a manufacturing process of the upper wafer subsequent to FIG. 3.

Then, as shown in FIG. 4, a deep separation groove 5a is formed in the substrate 1SA by etching the insulating layer 3 and the substrate 1SA, which are exposed from the resist pattern RA, using the resist pattern RA as an etching mask. As shown in FIG. 4, the deep separation groove 5a extends from the main surface of the substrate 1SA along a direction crossing (vertically crossing) the main surface (that is, along a thickness direction of the substrate 1SA) and ends at a deeper position than the separation groove 2a for element separation.

Then, an insulating layer formed of a silicon oxide, for example, is formed on an inner side and a bottom surface of the deep separation groove 5a by removing the resist pattern RA and performing thermal oxidation processing on the substrate 1SA. Then, an insulating layer formed of, for example, a silicon oxide or a Low-k (low dielectric constant) material, is further deposited on the main surface of the substrate 1SA using a CVD (chemical vapor deposition) method or the like and the insulating layer is embedded in the deep separation groove 5a. Then, the excessive insulating layer formed outside the deep separation groove 5a is removed by an etchback method or a CMP (chemical mechanical polishing) method using anisotropic dry etching. As a result, as shown in FIGS. 5 and 6, the dummy penetrating separation portion 5b and the penetrating separation portion 5 in which an insulating layer is embedded within the deep separation groove 5a are formed (process 102A in FIG. 20).

Figure 5:
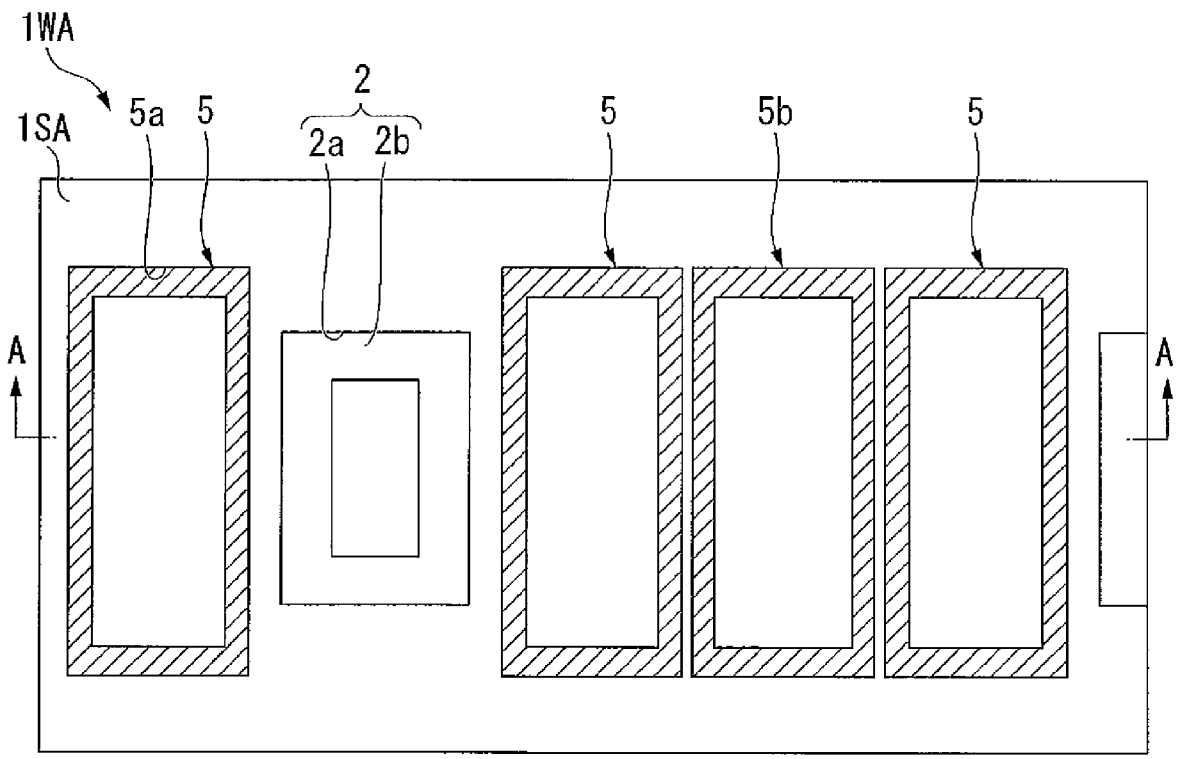
FIG. 5 is a plan view illustrating the main parts in a manufacturing process of the upper wafer subsequent to FIG. 4.
Figure 6:
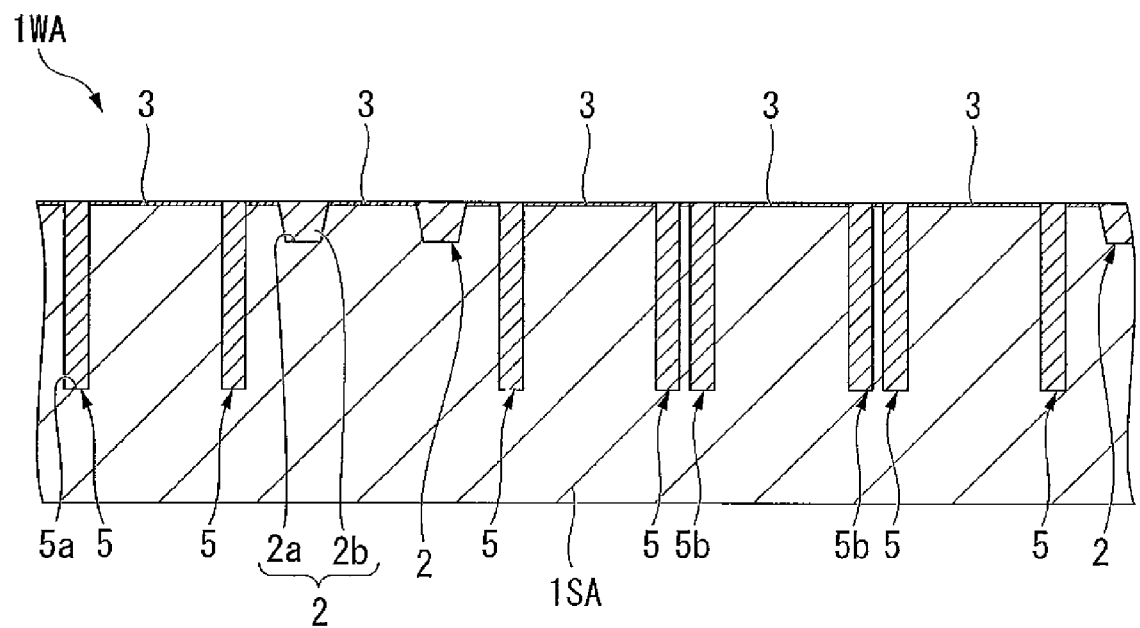
FIG. 6 is a cross-sectional view taken along the A-A of FIG. 5.

FIG. 6 is a cross-sectional view taken along the line A-A of FIG. 5. In addition, FIG. 5 is a plan view, and the penetrating separation portion 5 and the dummy penetrating separation portion 5b are shaded in order to make the drawing easily recognized. The penetrating separation portion 5 and the dummy penetrating separation portion 5b are formed in rectangular frame shapes in plan view, as shown in FIG. 5. The depth of the penetrating separation portion 5 and the depth of the dummy penetrating separation portion 5b (that is, the depth of the deep separation groove 5a) may be larger than, the same as, or smaller than those of the penetrating wiring portion 9 and dummy penetrating wiring portion 9b (refer to FIG. 10). For example, when the size of the gap between the upper and lower wafers 1WA and 1WB which is a gap between the lamination surfaces 30a and 30b of the upper and lower wafers 1WA and 1WB is controlled by the depths of the penetrating separation portion 5 and dummy penetrating separation portion 5b like the semiconductor device shown in FIG. 19, the depths of the penetrating separation portion 5 and dummy penetrating separation portion 5b are made larger than those of the penetrating wiring portion 9 and dummy penetrating wiring portion 9b. In addition, when the size of the gap is controlled by the depths of the penetrating wiring portion 9 and dummy penetrating wiring portion 9b, the depths of the penetrating separation portion 5 and dummy penetrating separation portion 5b may be made smaller than those of the penetrating wiring portion 9 and dummy penetrating wiring portion 9b. In addition, when the size of the gap is controlled by both the penetrating separation portion 5 and the penetrating wiring portion 9, at least one of the dummy penetrating separation portion 5b and the dummy penetrating wiring portion 9b may be formed to be as deep as the penetrating separation portion 5 and the penetrating wiring portion 9. In addition, when the size of the gap is controlled by other materials, the depths may be set such that the bump 26 and the penetrating wiring portion 9 are connected to each other.

In addition, when the depths of the penetrating separation portion 5 and dummy penetrating separation portion 5b are made larger than those of the penetrating wiring portion 9 and dummy penetrating wiring portion 9b or the depths of the penetrating separation portion 5 and dummy penetrating separation portion 5b are made equal to those of the penetrating wiring portion 9 and dummy penetrating wiring portion 9b, a variation in load applied to the penetrating wiring portion 9 in laminating the upper and lower wafers 1WA and 1WB together can be further reduced.

Figure 7:
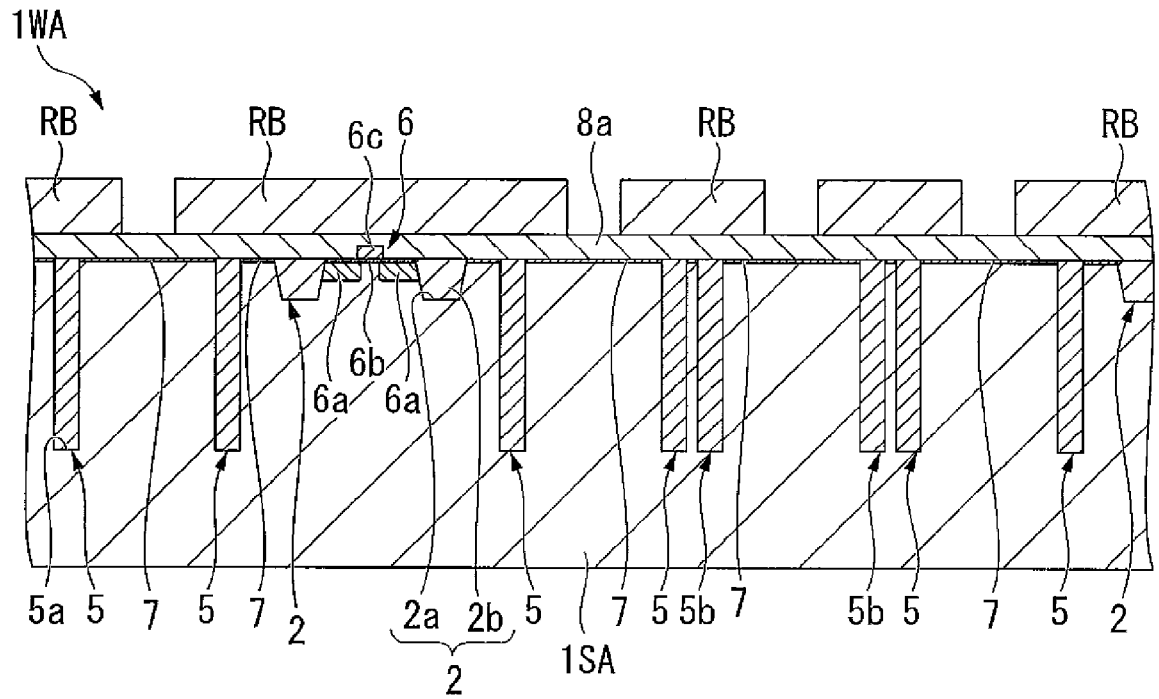
FIG. 7 is a cross-sectional view illustrating the main parts in a manufacturing process of the upper wafer subsequent to FIGS. 5 and 6.

Then, the insulating layer 3 is removed and an element, such as the MOSFET 6 shown in FIG. 7 having the semiconductor region 6a for source and drain, the gate insulating layer 6b, and the gate electrode 6c, is formed in an active region surrounded by the grooved separating portion 2 of the substrate 1SA process 103A in FIG. 20). Then, the insulating layer 7 which is an insulating layer formed of a silicon oxide, for example, is formed on the main surface of the active region of the substrate 1SA.

In this case, for example, if the penetrating separation portion 5 and the dummy penetrating separation portion 5b are formed after the MOSFET 6 is formed, there is a possibility that impurities present in the substrate 1SA (the semiconductor region 6a for source and drain and a channel-forming region below the gate electrode 6c) may be diffused again at the time of thermal oxidation processing for forming the insulating layer that forms the penetrating separation portion 5 and the dummy penetrating separation portion 5b. As a result, electrical characteristics, such as the threshold voltage, of the MOSFET 6, may be changed. On the other hand, in the present embodiment, since the MOSFET 6 is formed after the penetrating separation portion 5 and the dummy penetrating separation portion 5b are formed, a change in the electrical characteristics of the MOSFET 6 caused by the high processing temperature in forming the penetrating separation portion 5 and the dummy penetrating separation portion 5b can be prevented. Accordingly, the reliability of the semiconductor device can be improved.

Figure 8:
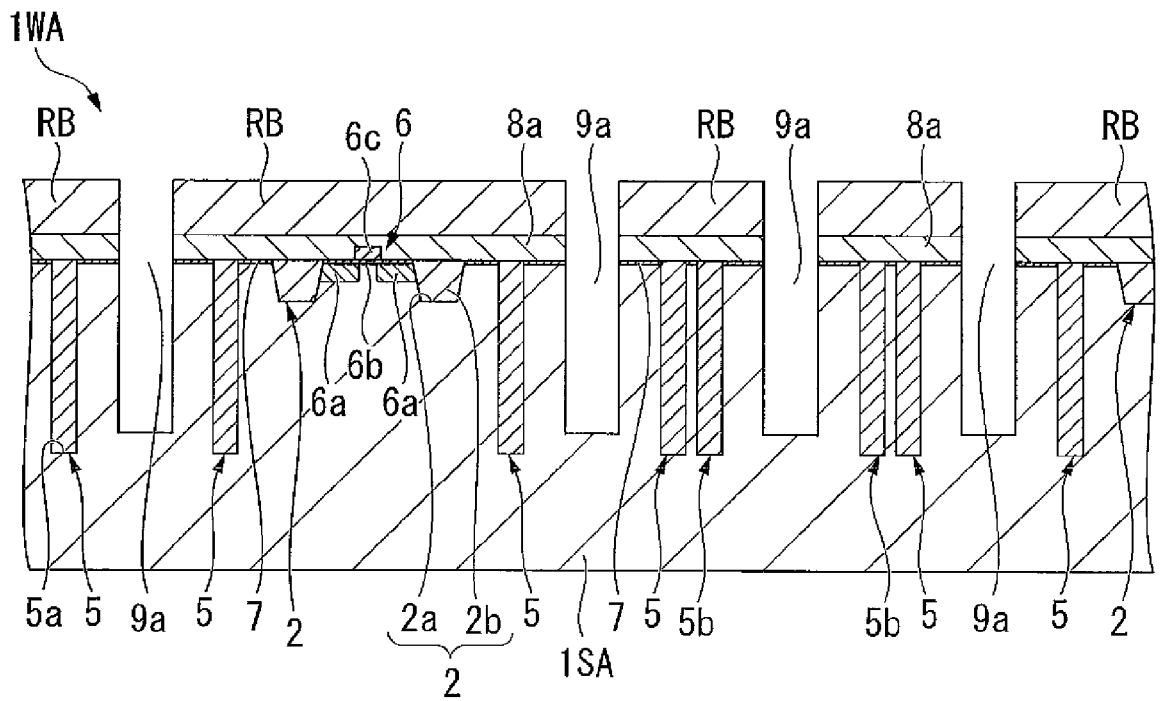
FIG. 8 is a cross-sectional view illustrating the main parts in a manufacturing process of the upper wafer subsequent to FIG. 7.

Then, the penetrating wiring portion 9 and the dummy penetrating wiring portion 9b are formed simultaneously. First, the interlayer insulating layer 8a shown in FIG. 7 is formed by depositing an insulating layer formed of, for example, a silicon oxide on the main surface of the substrate 1SA using the CVD method and making an upper surface of the insulating layer flat. Subsequently, a resist pattern RB is formed on the interlayer insulating layer 8a using lithographic processing. As shown in FIG. 7, the resist pattern RB is formed such that a region where the penetrating wiring portion 9 and the dummy penetrating wiring portion 9b are formed is exposed and the other regions are covered. Then, as shown in FIG. 8, a deep conductive groove 9a serving as the penetrating wiring portion 9 and the dummy penetrating wiring portion 9b is formed in substrate 1SA by etching the interlayer insulating layer 8a, the insulating layer 7, and the substrate 1SA, which are exposed from the resist pattern RB, using the resist pattern RB as an etching mask. The deep conductive groove 9a extends from the upper surface of the interlayer insulating layer 8a to the substrate 1SA along a direction crossing (vertically crossing) the upper surface (that is, along the thickness direction of the substrate 1SA) and ends at a deeper position (second position) than the separation groove 2a for element separation. The depth of the deep conductive groove 9a is the same as those described for the depths of the penetrating separation portion 5 and dummy penetrating separation portion 5b. Here, the case where the depth of the deep conductive groove 9a is smaller than that of the deep separation groove 5a is illustrated, as shown in FIG. 8.

Then, the resist pattern RB is removed, and a barrier conductor layer is deposited on the main surface of the substrate 1SA using a sputtering method, for example, and is formed to cover an inner surface (an inner side surface and a bottom surface) of the deep conductive groove 9a. Then, a main conductor layer is embedded in the deep conductive groove 9a by deposition using the CVD method, for example. In addition, the thickness of the main conductor layer is set to be larger than that of the barrier conductor layer. Then, as shown in FIGS. 9 and 10, a conductive portion serving as the penetrating wiring portion 9 and the dummy penetrating wiring portion 9b is formed by removing the excessive main conductor layer and barrier conductor layer, which are formed outside the deep conductive groove 9a, by polishing using the CMP method, for example, making the main conductor layer and the barrier conductor layer remain only in the deep conductive groove 9a (process 104A in FIG. 20).

Figure 10:
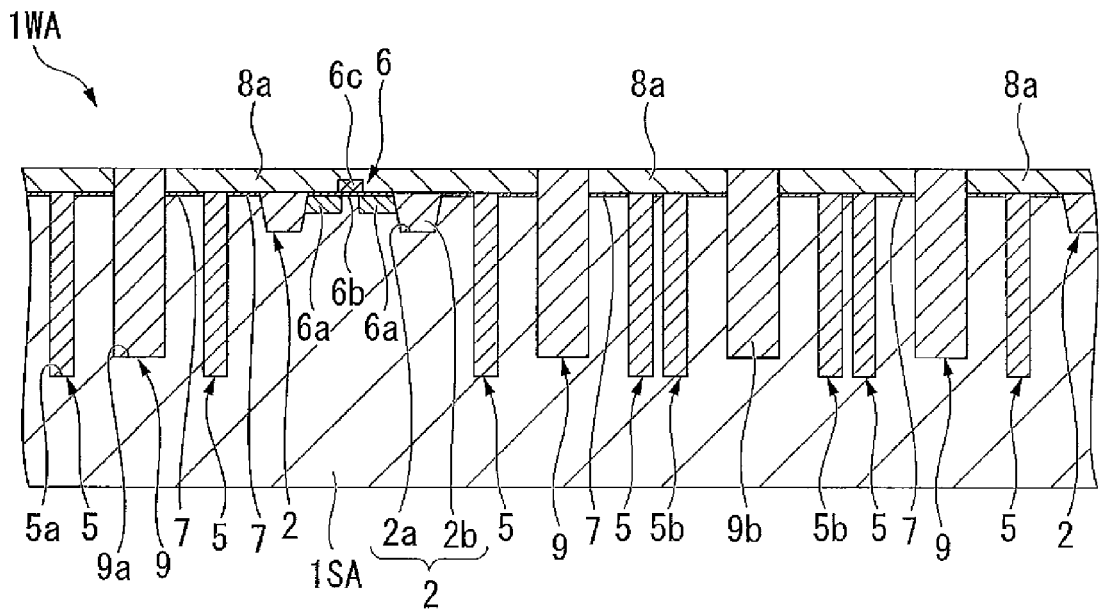
FIG. 10 is a cross-sectional view taken along the A-A of FIG. 9.

FIG. 10 is a cross-sectional view taken along the line A-A of FIG. 9. In addition, FIG. 9 is a plan view, and the penetrating separation portion 5, the dummy penetrating separation portion 5b, the penetrating wiring portion 9, and the dummy penetrating wiring portion 9b are shaded in order to make the drawing easy to understand. In addition, as shown in FIG. 9, the penetrating wiring portion 9 and the dummy penetrating wiring portion 9b are formed to have a long rectangular shape in plan view. The penetrating wiring portion 9 is disposed within the frame of the penetrating separation portion 5 in a state of being separated from the penetrating separation portion 5 with a predetermined gap therebetween. That is, each penetrating wiring portion 9 is surrounded by the penetrating separation portion 5 which is disposed around the penetrating wiring portion 9 with the predetermined gap therebetween. In addition, the dummy penetrating wiring portion 9b is disposed within the frame of the dummy penetrating separation portion 5b in a state of being separated from the dummy penetrating separation portion 5b with a predetermined gap therebetween. That is, each dummy penetrating wiring portion 9b is surrounded by the dummy penetrating separation portion 5b which is disposed around the dummy penetrating wiring portion 9b with the predetermined gap therebetween.

Furthermore, although the penetrating separation portion 5 and the penetrating wiring portion 9 are separately formed and the dummy penetrating separation portion 5b and the dummy penetrating wiring portion 9b are separately formed in the semiconductor device according to the present embodiment, the penetrating separation portion 5 and the penetrating wiring portion 9 may be unified and the dummy penetrating separation portion 5b and the dummy penetrating wiring portion 9b may be unified. However, when the penetrating separation portion 5 and the penetrating wiring portion 9 are unified or when the dummy penetrating separation portion 5b and the dummy penetrating wiring portion 9b are unified, the penetrating separation portion 5 and the penetrating wiring portion 9 or the dummy penetrating separation portion 5b and the dummy penetrating wiring portion 9b should be formed in the same process. For this reason, in the case of forming the penetrating separation portion 5 and the dummy penetrating separation portion 5b before element formation in order to prevent a change in element characteristics caused by thermal oxidation processing for forming the insulating layer that forms the penetrating separation portion 5 and the dummy penetrating separation portion 5b, the penetrating wiring portion 9 and the dummy penetrating wiring portion 9b should also be formed before element formation. However, the possibility of deterioration of element characteristics and metal contamination being high occurs if the penetrating wiring portion 9 and the dummy penetrating wiring portion 9b are formed before element formation.

On the other hand, in the present embodiment, the penetrating separation portion 5 and the penetrating wiring portion 9 can be separately formed and the dummy penetrating separation portion 5b and the dummy penetrating wiring portion 9b can be separately formed, and the penetrating wiring portion 9 and the dummy penetrating wiring portion 9b can be formed after the MOSFET 6 and the interlayer insulating layer 8a are formed. Accordingly, the possibility of deterioration of element characteristics and metal contamination can be further reduced. As a result, electrical characteristics of the device can be improved. In addition, the penetrating separation portion 5 and the penetrating wiring portion 9 are separately formed and the dummy penetrating separation portion 5b and the dummy penetrating wiring portion 9b are separately formed, and each penetrating wiring portion 9 is surrounded by the penetrating separation portion 5 which is disposed around the penetrating wiring portion 9 with the predetermined gap therebetween and each dummy penetrating wiring portion 9b is surrounded by the dummy penetrating separation portion 5b which is disposed around the dummy penetrating wiring portion 9b with the predetermined gap therebetween. Accordingly, the penetrating wiring portion 9 is effectively reinforced by the penetrating separation portion 5 and the dummy penetrating separation portion 5b. As a result, according to the present embodiment, damage to the penetrating wiring portion 9 in laminating the upper and lower wafers 1WA and 1WB together can be effectively prevented compared with the case where the penetrating separation portion 5 and the penetrating wiring portion 9 are unified and the case where the dummy penetrating separation portion 5b and the dummy penetrating wiring portion 9b are unified.

In addition, the number of penetrating wiring portions 9 in the penetrating separation portion 5 and the number of dummy penetrating wiring portions 9b in the dummy penetrating separation portion 5b are not limited to one. For example, a plurality of penetrating wiring portions 9 may be arrayed in parallel within the frame of one penetrating separation portion 5, or a plurality of dummy penetrating wiring portions 9b may be arrayed in parallel within the frame of one dummy penetrating separation portion 5b. In addition, the planar shapes of the penetrating separation portion 5 and dummy penetrating separation portion 5b are not limited to the example shown in FIG. 9, and may have other shapes, such as that of a square.

Figure 11:
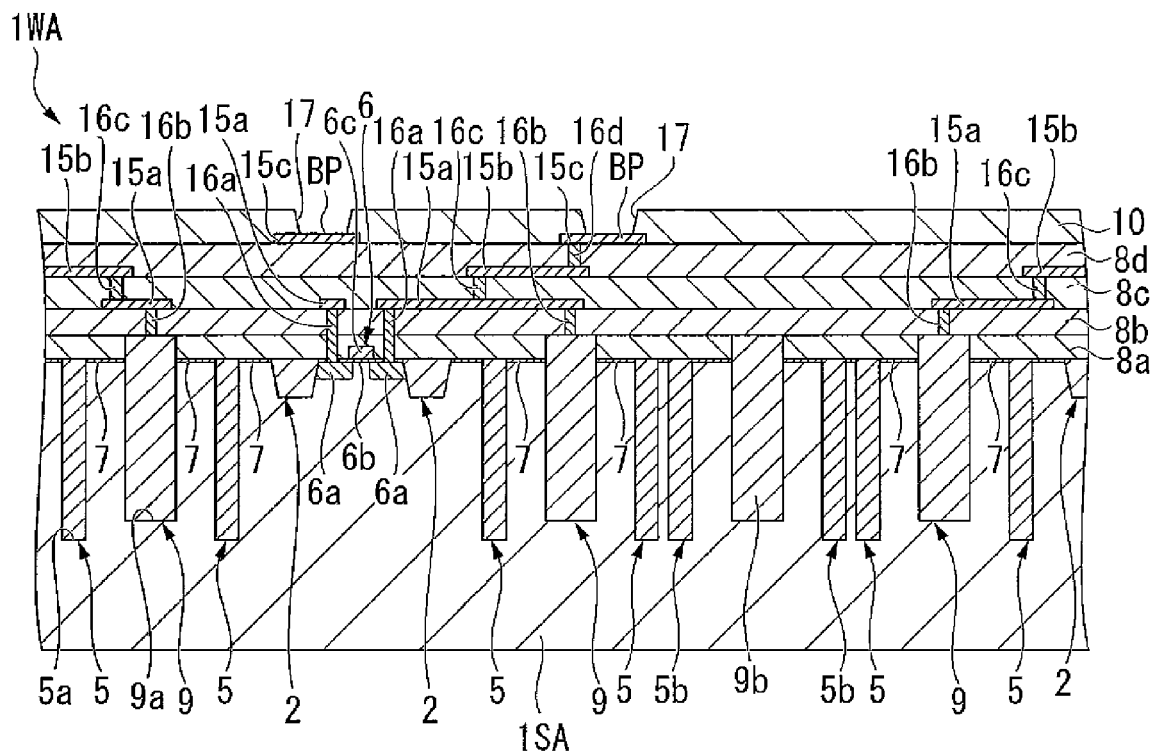
FIG. 11 is a cross-sectional view illustrating the main parts in a manufacturing process of the upper wafer subsequent to FIGS. 9 and 10.

Then, as shown in FIG. 11, a multilayered wiring is formed by forming the interlayer insulating layers 8b, 8c, and 8d, the passivation layer 10, the wiring lines 15a, 15b, and 15c, the plugs 16a, 16b, 16c, and 16d, the opening 17, and the laminating pad BP on the main surface of the substrate 1SA using a normal wiring line-forming method for a semiconductor device (process 105A in FIG. 20).

Figure 12:
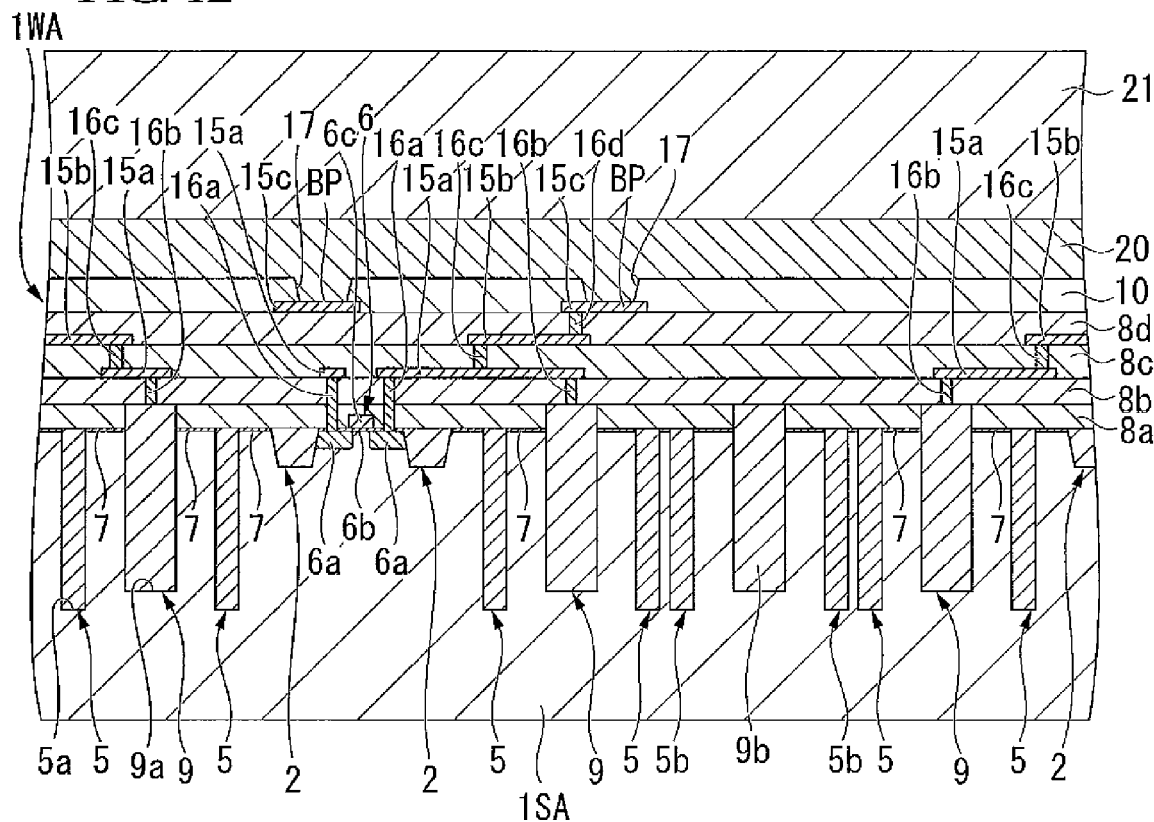
FIG. 12 is a cross-sectional view illustrating the main parts in a manufacturing process of the upper wafer subsequent to FIG. 11.

Then, as shown in FIG. 12, a glass supporting substrate 21 is laminated on the main surface of the wafer 1WA with an adhesive sheet 20. Thus, by laminating the glass support substrate 21 on the main surface of the wafer 1WA, the wafer 1WA can be stably handled and the mechanical strength of the thin wafer 1WA after subsequent thinning processing can be secured. Then, the thinning processing is performed on the wafer 1WA (process 107 in FIG. 20). The thinning processing on the wafer 1WA in the present embodiment includes first thinning processing, second thinning processing, and third thinning processing, which will be described below.

Figure 13:
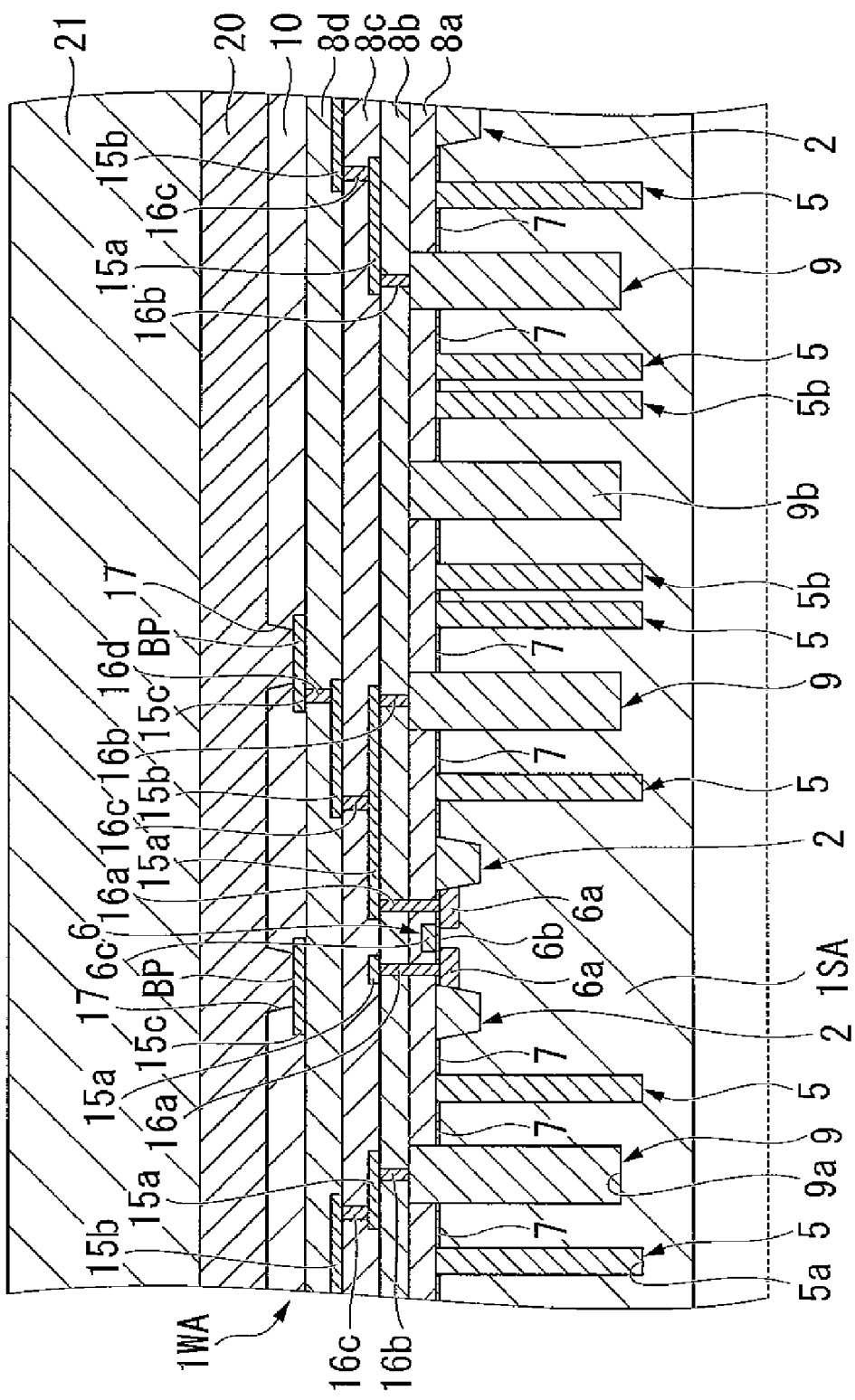
FIG. 13 is a cross-sectional view illustrating the main parts of the upper wafer after first thinning processing subsequent to FIG. 12.

In the first thinning processing, a bottom surface (that is, a bottom surface of the substrate 1SA) of the wafer 1WA is ground until the bottom surface has a desired thickness in a state where the glass support substrate 21 is fixed to the main surface of the wafer 1WA, as shown in FIG. 13. The first thinning processing is thinning processing related to a mechanical element, as illustrated by grinding. Then, grinding processing as a second thinning processing is performed on the bottom surface of the wafer 1WA. The second thinning processing is thinning processing related to both a mechanical element and a chemical element, such as CMP, as illustrated by polishing. FIG. 13 is a cross-sectional view illustrating the main parts of the upper wafer 1WA after the second thinning processing. The dotted line shown in FIG. 13 indicates the substrate 1SA before the first thinning processing. As shown in FIG. 13, the first and second thinning processing is ended before reaching the penetrating separation portion 5, the dummy penetrating separation portion 5b, the penetrating wiring portion 9, and the dummy penetrating wiring portion 9b (that is, in a state where the penetrating separation portion 5, the dummy penetrating separation portion 5b, the penetrating wiring portion 9, and the dummy penetrating wiring portion 9b are not exposed from the bottom surface of the wafer 1WA).

By performing the first and second thinning processing, the time taken for wafer thinning processing can be shortened. In addition, by performing the second thinning processing, a damaged layer generated on the bottom surface of the wafer 1WA by grinding in the first thinning processing can be removed and the bottom surface of the wafer 1WA can be made smooth. Accordingly, the chemical stability of the bottom surface of the wafer 1WA can be made uniform. As a result, the etched amount of the entire bottom surface of the wafer 1WA in the thickness direction of the wafer 1WA can be made uniform at the time of subsequent etching processing (third thinning processing) on a bottom surface portion of the wafer 1WA.

Figure 14:
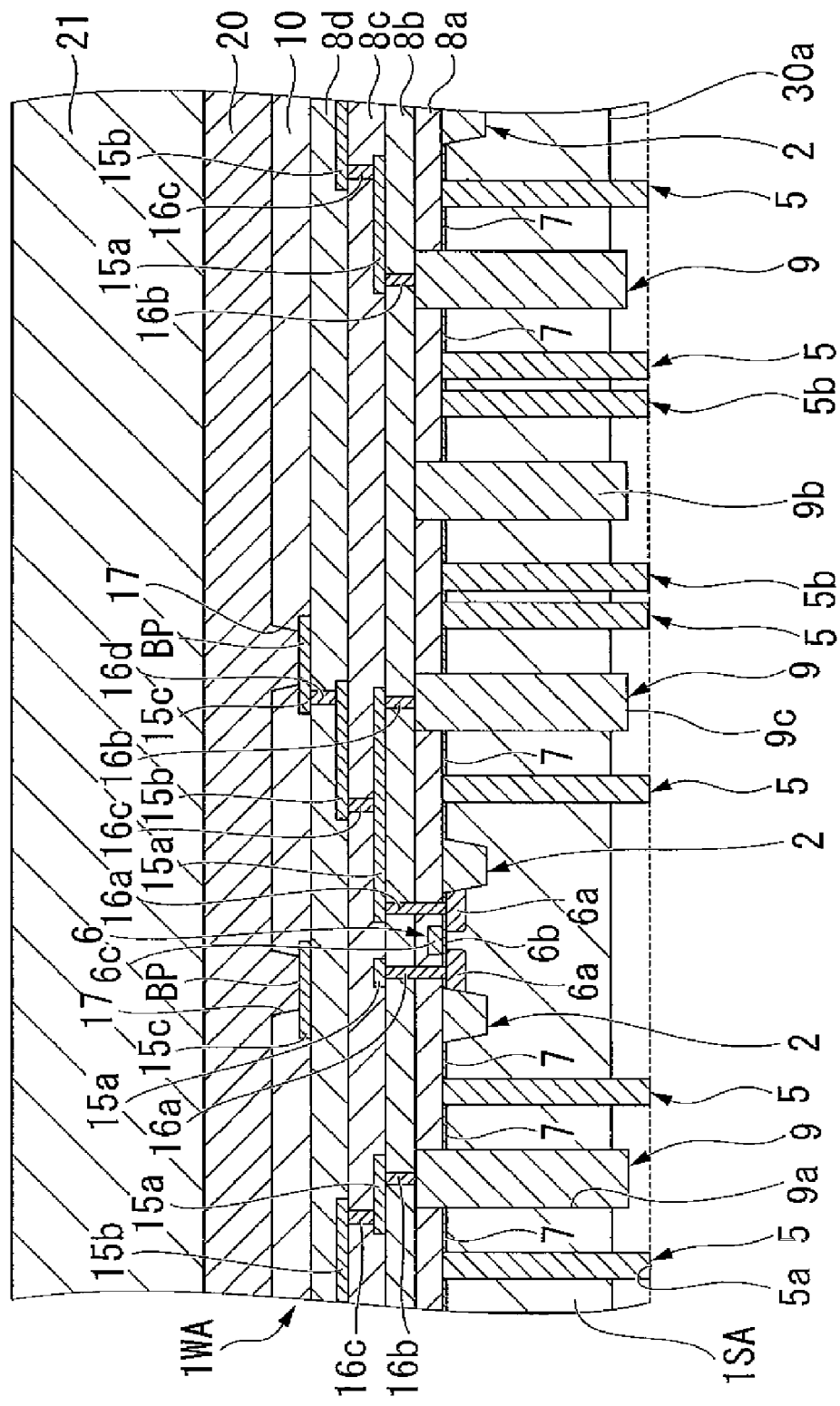
FIG. 14 is a cross-sectional view illustrating the main parts of the upper wafer after second thinning processing subsequent to FIG. 13.

In the third thinning processing, as shown in FIG. 14, an end of the penetrating separation portion 5, an end of the dummy penetrating separation portion 5b, an end 9c of the penetrating wiring portion 9, and an end of the dummy penetrating wiring portion 9b are exposed from the bottom surface of the wafer 1WA by dipping the bottom surface of the wafer 1WA into the chemical to perform etching (wet etching) of the bottom surface in a state where the glass support substrate 21 is fixed to the main surface of the wafer 1WA. FIG. 14 is a cross-sectional view illustrating the main parts of the upper wafer 1WA after the third thinning processing. The dotted line shown in FIG. 14 indicates the substrate 1SA before the third thinning processing. As shown in FIG. 14, in the upper wafer 1WA after the third thinning processing, some of the lower portions of the penetrating separation portion 5, dummy penetrating separation portion 5b, penetrating wiring portion 9, and dummy penetrating wiring portion 9b protrude to be exposed by a desired length from the bottom surface of the wafer 1WA after the third thinning processing, which is the lamination surface 30a. Protruding lengths of the end of the penetrating separation portion 5, end of the dummy penetrating separation portion 5b, end 9c of the penetrating wiring portion 9, and the end of the dummy penetrating wiring portion 9b, which protrude from the bottom surface of the wafer 1WA, are suitably determined in consideration of the gap between the lamination surfaces 30a and 30b of the upper and lower wafers 1WA and 1WB.

By the third thinning processing, the penetrating wiring portion 9 and the dummy penetrating wiring portion 9b are separated from the substrate 1SA by the penetrating separation portion 5 or the dummy penetrating separation portion 5b in the side surface direction. In addition, since the penetrating wiring portion 9 and the dummy penetrating wiring portion 9b are exposed at the lower portions of the penetrating wiring portion 9 and dummy penetrating wiring portion 9b, the penetrating wiring portion 9 and the dummy penetrating wiring portion 9b are separated from the substrate 1SA. As a result, the penetrating wiring portion 9 and the dummy penetrating wiring portion 9b are completely electrically separated from the substrate 1SA. In addition, the deep separation groove 5a and the deep conductive groove 9a in this stage become holes passing between the main and bottom surfaces of the substrate 1SA.

Moreover, in the above example, a case where the first thinning processing (grinding), the second thinning processing (polishing), and the third thinning processing (etching) are performed sequentially in the processing for making the wafer 1WA thin has been described. However, for example, the first thinning processing (grinding) or the second thinning processing (polishing) may be excluded.

Thus, the manufacturing process of the upper wafer 1WA is completed.

Next, a manufacturing process of a lower wafer will be described. Here, a manufacturing process (manufacturing process of lower wafers of second and subsequent layers in FIG. 20) of the lowermost wafer with a bottom surface to which other wafers are not laminated, for example, as a lower wafer will be described. The manufacturing process of the lower wafer which is the lowermost wafer is almost the same as the manufacturing process (processes 100A to 107A in FIG. 20) of the upper wafer 1WA. Here, the manufacturing process of the lowermost wafer is different from that of the upper wafer 1WA in that a bump-forming process (process 106B) is performed after a process (process 105B) of forming a multilayered wiring layer shown in FIG. 20 and a wafer thinning process (process 107A), a process (process 102B) of forming a penetrating separation portion, and a process (process 104B) of forming a penetrating wiring portion (and the dummy penetrating wiring portion 9b) are not performed.

Figure 15:
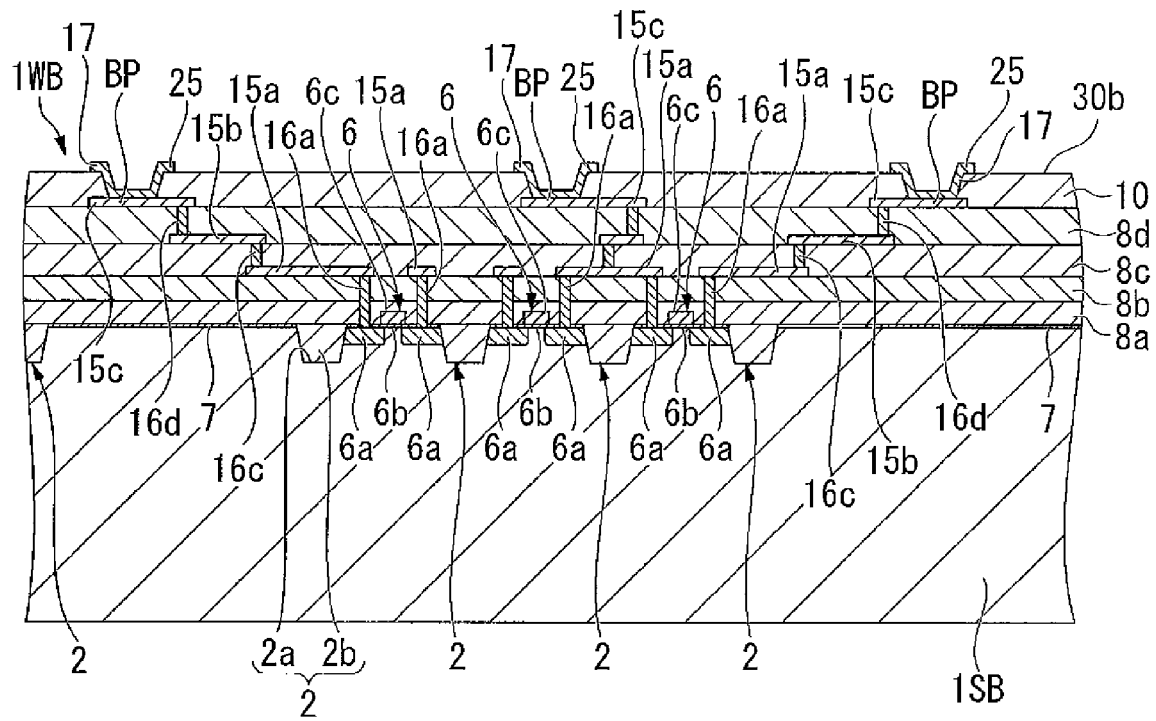
FIG. 15 is a cross-sectional view illustrating the main parts of a lower wafer in a stage of a bump forming process.

FIG. 15 is a cross-sectional view illustrating the main parts of the lower wafer (lowermost wafer) 1WB in stages of a process 100B in FIG. 20 to the bump-forming process 106B through the process 105B (process 102B and process 104B in FIG. 20 are not performed). After the process 105B of forming a multilayered wiring layer, the bump base conductor pattern 25 is formed by depositing a conductor layer on the main surface of the wafer 1WB using a sputtering method, for example, and patterning the conductor layer using lithographic processing and etching processing.

Figure 16:
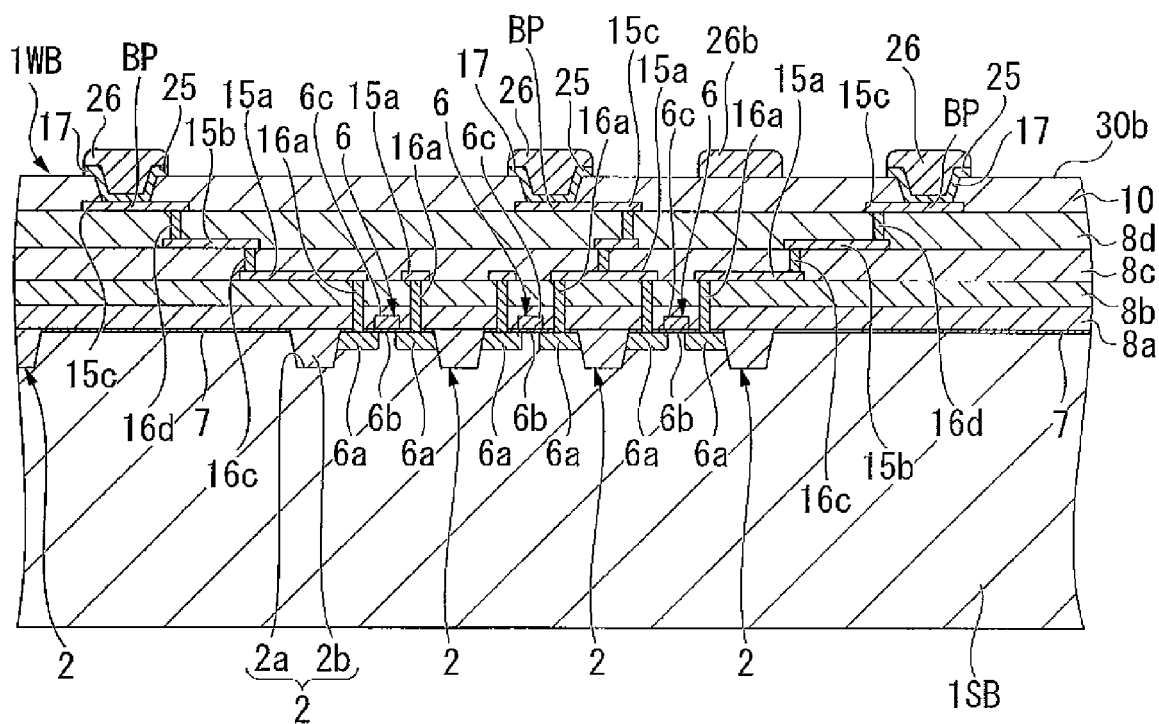
FIG. 16 is a cross-sectional view illustrating the main parts in a manufacturing process of the lower wafer subsequent to FIG. 15.

Then, as shown in FIG. 16, a bump 26 and a plurality of dummy bumps 26b are formed simultaneously on the bump base conductor pattern 25 exposed on the main surface of the lower wafer 1WB, which is the lamination surface 30b, using a lift-off method, an electrolytic plating method, a printing method, or a ball dropping method, for example. The bump 26 and the dummy bump 26b are formed to protrude from the lamination surface 30b. The dummy bump 26b is formed in a region where the bump 26 is not disposed on the lamination surface 30b. The dummy bump 26b is formed in the same shape as the bump 26, using the same material as the bump 26, at a position opposite the dummy penetrating wiring portion 9b when the lamination surface 30b and the lamination surface 30a of the upper wafer 1WA are made to face each other.

Thus, the manufacturing process of the lower wafer 1WB is completed.

Figure 17:
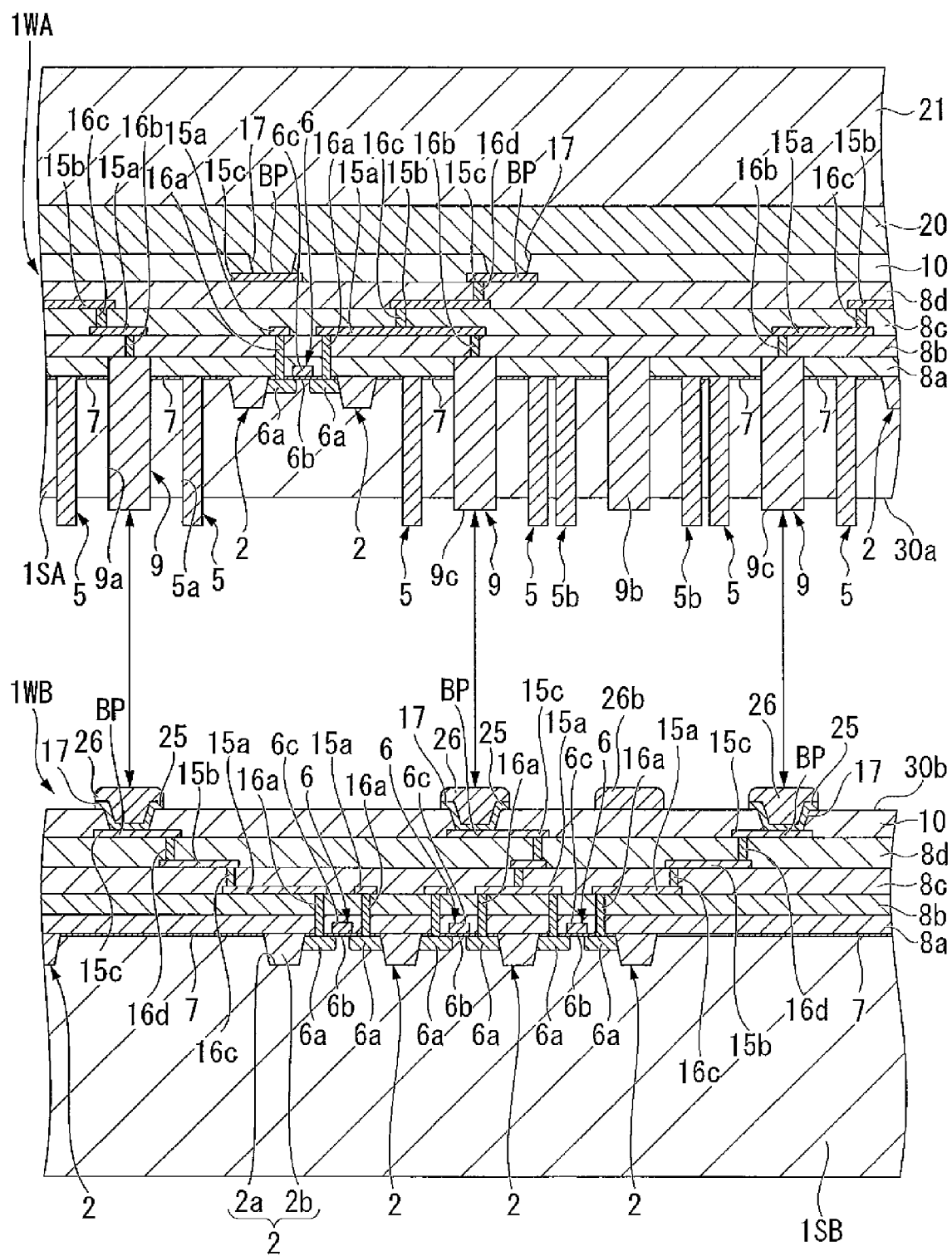
FIG. 17 is a cross-sectional view illustrating the main parts in a process of laminating upper and lower wafers together.

Then, the upper and lower wafers 1WA and 1WB manufactured as described above are laminated together (laminating process of upper and lower wafers of first and second layers in FIG. 20). First, as shown in FIG. 17, the lower wafer 1WB shown in FIG. 16 is fixed and then the upper wafer 1WA shown in FIG. 14 is disposed on the main surface (lamination surface 30b) of the lower wafer 1WB such that the bottom surface (lamination surface 30a) faces the main surface of the lower wafer 1WB.

Then, relative positioning between the lower wafer 1WB and the upper wafer 1WA is performed. Specifically, positioning of the bump 26 on the main surface of the lower wafer 1WB and the penetrating wiring portion 9 of the bottom surface of the upper wafer 1WA corresponding to the bump 26 is performed, and positioning of the dummy bump 26 and the dummy penetrating wiring portion 9b corresponding to the dummy bump 26 is performed (process 201 in FIG. 20). Thereafter, as shown in FIG. 18, the opposite surfaces (lamination surfaces 30a and 30b) of the upper and lower wafers 1WA and 1WB are brought close to each other to make the upper wafer 1WA and the lower wafer 1WB overlap each other. Then, the bump 26 on the main surface of the lower wafer 1WB and the penetrating wiring portion 9 of the bottom surface of the upper wafer 1WA are brought into contact with each other to be electrically connected, and the dummy bump 26b and the dummy penetrating wiring portion 9b corresponding to the dummy bump 26b are brought into contact with each other. Thus, semiconductor circuit portions of the upper and lower wafers 1WA and 1WB are electrically connected to each other, forming a desired semiconductor circuit (process 202 in FIG. 20).

Here, each bump 26 and the dummy bump 26b on the main surface of the lower wafer 1WB is settled within the frame of the penetrating separation portion 5 or the dummy penetrating separation portion 5b that surrounds the periphery of the penetrating wiring portion 9 or the dummy penetrating wiring portion 9b of the bottom surface of the upper wafer 1WA to which the bump 26 or the dummy bump 26b is connected.

In addition, the bump 26 is connected to the penetrating wiring portion 9, and the penetrating wiring portion 9 may not be settled within the frame of the penetrating separation portion 5. In this case, it is preferable that a gap between the lamination surface 30a and the lamination surface 30b be set sufficiently larger than the height of the bump 26, the wafer 1WA and the bump 26 be made so as not to be in contact with each other, and the wafer 1WA and the bump 26 be insulated from each other by the adhesive 30.

Then, the insulating adhesive 30 is injected between the opposite lamination surfaces 30a and 30b of the upper and lower wafers 1WA and 1WB (process 203 in FIG. 20). Then, the glass support substrate 21 is peeled off from the main surface of the upper wafer 1WA. This is the semiconductor device shown in FIG. 19.

A chip is obtained by cutting the semiconductor device shown in FIG. 19 in the unit of a chip after the above-described processes. The chip obtained as described above has a three-dimensional configuration in which a plurality of wafers are laminated to overlap. That is, in this chip, the semiconductor circuits formed in the wafers, which form the chip, are electrically connected to each other through the penetrating wiring portion 9 and the bump 26. As a result, one desired semiconductor integrated circuit is formed.

In the semiconductor device according to the present embodiment, the upper and lower wafers 1WA and 1WB are laminated to each other. An electric signal connecting portion formed by the end 9c of the penetrating wiring portion 9 is provided on the lamination surface 30a of the upper wafer 1WA facing the lower wafer 1WB, and an electric signal connecting portion formed by the bump 26 is provided on the lamination surface 30b of the lower wafer 1WB facing the upper wafer 1WA. The desired semiconductor circuit is formed by electrically connecting the end 9c of the penetrating wiring portion 9 of the upper wafer 1WA with the bump 26 of the lower wafer 1WB. Furthermore, in the semiconductor device according to the present embodiment, the end 9c of the penetrating wiring portion 9 of the upper wafer 1WA and the bump 26 of the lower wafer 1WB are protruding connection portions that are formed to protrude from the lamination surfaces 30a and 30b, respectively. In addition, in an area where the penetrating wiring portion 9 (bump 26) is not disposed on the lamination surface 30a (30b), the dummy penetrating wiring portion 9b (dummy bump 26b) which is insulated from the semiconductor circuit and which protrudes from the lamination surface 30a (30b) to have the same height as the penetrating wiring portion 9 (bump 26) is formed, and the dummy penetrating separation portion 5b which protrudes from the lamination surface 30a to be higher than the penetrating wiring portion 9 is formed. Accordingly, since the load applied to the penetrating wiring portion 9 and the bump 26 is also applied to the dummy penetrating wiring portion 9b, the dummy penetrating separation portion 5b, and the dummy bump 26b when laminating the upper and lower wafers 1WA and 1WB together, a variation in load applied to the penetrating wiring portion 9 and the bump 26 is reduced. As a result, damage to the penetrating wiring portion 9 and the bump 26 occurring when laminating the upper and lower wafers 1WA and 1WB together can be effectively prevented.

Furthermore, although the dummy penetrating separation portion 5b and the dummy penetrating wiring portion 9b are formed as reinforcing protruding portions in the upper wafer 1WA in the semiconductor device according to the present embodiment, only one of the dummy penetrating separation portion 5b and the dummy penetrating wiring portion 9b may be formed. In addition, in the case of forming only one of the dummy penetrating separation portion 5b and the dummy penetrating wiring portion 9b, it is preferable to form only the dummy penetrating wiring portion 9b when the depth of the penetrating wiring portion 9 is larger than that of the penetrating separation portion 5 and to form only the dummy penetrating separation portion 5b when the depth of the penetrating separation portion 5 is larger than that of the penetrating wiring portion 9. In addition, when both the dummy penetrating separation portion 5b and the dummy penetrating wiring portion 9b are formed as the reinforcing protruding portions, the protruding connection portions can be effectively reinforced even if there is a manufacturing variation.

Furthermore, since the dummy penetrating wiring portion 9b is formed to have the same shape as the penetrating wiring portion 9 using the same material as the penetrating wiring portion 9 in the semiconductor device according to the present embodiment, the dummy penetrating wiring portion 9b and the penetrating wiring portion 9 can be formed simultaneously. Accordingly, the dummy penetrating wiring portion 9b and the penetrating wiring portion 9 can be easily manufactured.

Furthermore, since the dummy bump 26b is formed to have the same shape as the bump 26 using the same material as the bump 26 in the semiconductor device according to the present embodiment, the dummy bump 26b and the bump 26 can be formed simultaneously. Accordingly, the dummy bump 26b and the bump 26 can be easily manufactured.

Furthermore, in the semiconductor device according to the present embodiment, the penetrating wiring portion 9 is surrounded by the penetrating separation portion 5 formed of an insulating layer, which has a frame shape in plan view, on the lamination surface 30a and the dummy penetrating separation portion 5b functioning as a reinforcing protruding portion is formed using the same material as the penetrating separation portion 5. Accordingly, since the penetrating separation portion 5 and the dummy penetrating separation portion 5b can be formed simultaneously, the dummy penetrating separation portion 5b, which is a reinforcing protruding portion, can be formed easily and efficiently without increasing the number of manufacturing processes compared with the case where the dummy penetrating separation portion 5b is not formed.

In addition, a method of manufacturing the semiconductor device according to the present embodiment includes: a process of forming the penetrating wiring portion 9 (bump 26), which protrudes from the lamination surface 30a (30b), on the lamination surface 30a (30b) of the wafer 1WA (1WB); a process of forming the dummy penetrating wiring portion 9b (dummy bump 26b) (dummy penetrating separation portion 5b protruding from the lamination surface 30a to be higher than the penetrating wiring portion 9), which is insulated from a semiconductor circuit and protrudes from the lamination surface 30a (30b) to have the same height as the penetrating wiring portion 9 (bump 26), in an area where the penetrating wiring portion 9 (bump 26) is not disposed on the lamination surface 30a (30b) formed with the penetrating wiring portion 9 (bump 26); and a process of forming a desired semiconductor circuit by laminating the upper and lower wafers 1WA and 1WB together and electrically connecting the penetrating wiring portion 9 of the upper wafer 1WA with the bump 26 of the lower wafer 1WB. Accordingly, since the load applied to the penetrating wiring portion 9 and the bump 26 is also applied to the dummy penetrating wiring portion 9b (dummy bump 26b) (dummy penetrating separation portion 5b) when laminating the upper and lower wafers 1WA and 1WB together, the variation in load applied to the penetrating wiring portion 9 and the bump 26 is reduced. Thus, according to the present embodiment, damage to the penetrating wiring portion 9 and the bump 26 occurring when laminating the upper and lower wafers 1WA and 1WB together can be effectively prevented. As a result, the semiconductor device which has excellent reliability and stable performance can be realized.

Moreover, in the method of manufacturing the semiconductor device according to the present embodiment, a process of forming the penetrating wiring portion 9 and a process of forming the dummy penetrating wiring portion 9b are simultaneously performed. Therefore, the penetrating wiring portion 9 and the dummy penetrating wiring portion 9b can be efficiently manufactured compared with a case where the penetrating wiring portion 9 and the dummy penetrating wiring portion 9b are separately formed.

Moreover, in the method of manufacturing the semiconductor device according to the present embodiment, a process of forming the bump 26 and a process of forming the dummy bump 26b are simultaneously performed. Therefore, the bump 26 and the dummy bump 26b can be efficiently manufactured compared with the case where the bump 26 and the dummy bump 26b are separately formed.

In addition, in the method of manufacturing the semiconductor device according to the present embodiment, the process of forming the penetrating wiring portion 9 and the process of forming the dummy penetrating wiring portion 9b include: a process of forming conductive portions, which become the penetrating wiring portion 9 and the dummy penetrating wiring portion 9b, by forming the deep conductive groove 9a on an opposite surface of a surface, which becomes the lamination surface 30a, of the upper wafer 1WA and embedding a conductor layer including a main conductor layer and a barrier conductor layer into the deep conductive groove 9a; a process of forming the interlayer insulating layer 8b, which insulates the conductive portion that becomes the dummy penetrating wiring portion 9b, on the opposite surface of the surface that becomes the lamination surface 30a and forming the wiring lines 15a, 15b, and 15c and the laminating pad BP electrically connected to the conductive portion that becomes the penetrating wiring portion 9; and a process of forming the penetrating wiring portion 9 and the dummy penetrating wiring portion 9b protruding from the lamination surface 30a by exposing parts of the conductive portions, which become the penetrating wiring portion 9 and the dummy penetrating wiring portion 9b, from the surface that becomes the lamination surface 30a of the upper wafer 1WA. Accordingly, since the dummy penetrating wiring portion 9b can be formed without increasing the number of processes, manufacturing can be efficiently performed compared with the case where the dummy penetrating wiring portion 9b is not formed.

Furthermore, in the method of manufacturing the semiconductor device according to the present embodiment, the process of forming the bump 26 and the process of forming the dummy bump 26b include a process of forming the bump 26 on the bump base conductor pattern 25 exposed on the lamination surface 30b of the lower wafer 1WB and forming the dummy bump 26b in an area where the bump base conductor pattern 25 is not disposed on the lamination surface 30b or a region which does not have an electric effect on other circuits.

Accordingly, since the dummy bump 26*b* can be formed without increasing the number of processes, manufacturing can be efficiently performed compared with the case where the dummy bump 26*b* is not formed.

Figure 21:
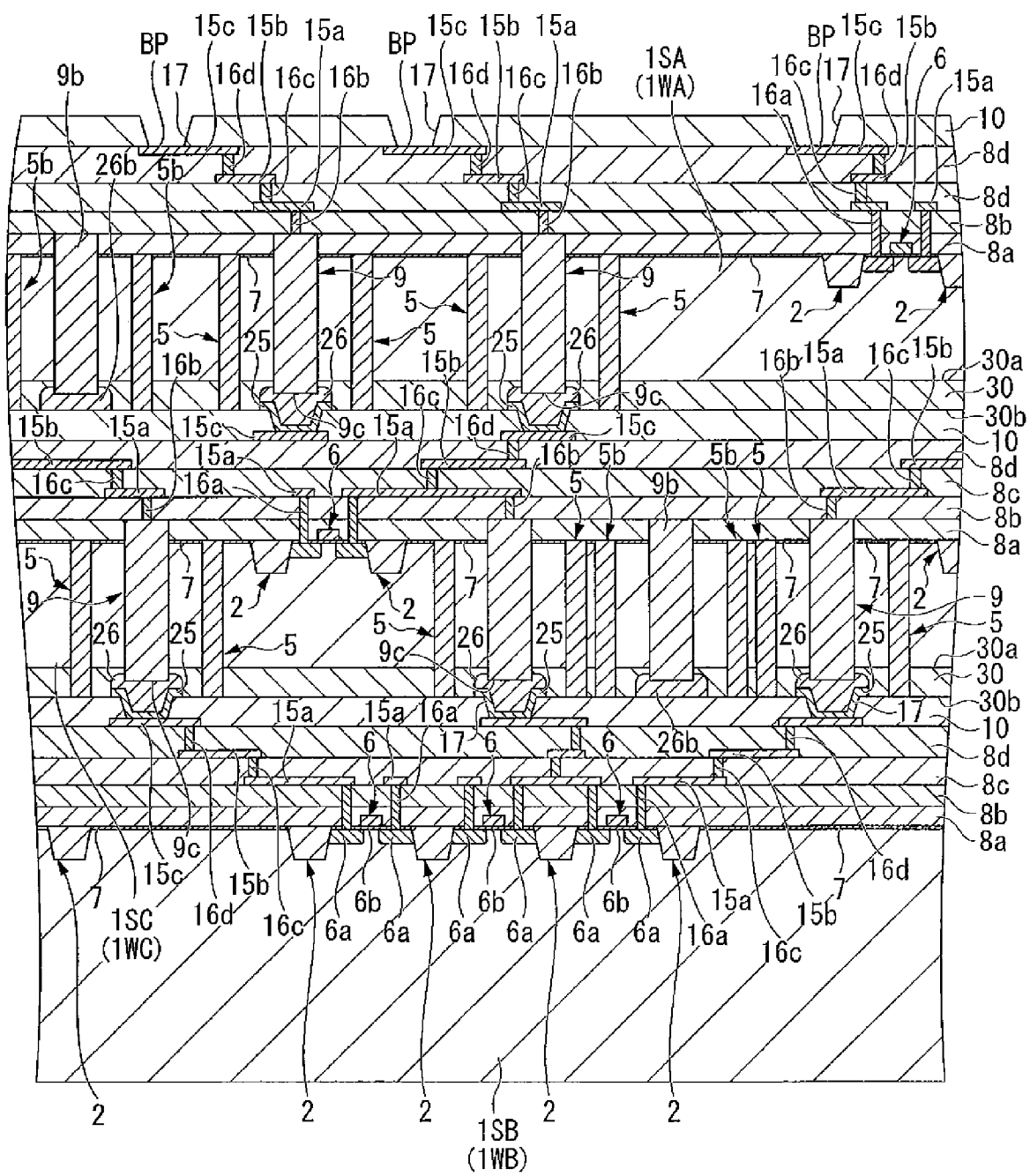
FIG. 21 is a cross-sectional view illustrating the main parts in another example of the semiconductor device of the invention.

In addition, the invention is not limited to only the example described above. For example, the number of wafers laminated may be three or more, even though the semiconductor device in which two wafers 1WA and 1WB are laminated together has been described in the example shown in FIG. 19. FIG. 21 is a cross-sectional view illustrating the main parts in another example of the semiconductor device of the invention. The semiconductor device shown in FIG. 21 is a three-dimensional semiconductor device with a multilayer laminating configuration in which substrates 1SA, 1SB, and 1SC are laminated so as to make three layers. Moreover, in the semiconductor device shown in FIG. 21, the same members as in FIG. 19 are denoted by the same reference numerals, and an explanation thereof will be omitted.

Next, an example of a manufacturing process of the semiconductor device shown in FIG. 21 will be described with reference to FIG. 20. First, the upper wafer 1WA is prepared as described in FIGS. 3 to 14. In addition, the lowermost wafer 1WB is prepared as described in FIGS. 15 and 16.

In addition, a middle wafer 1WC is prepared through the processes 100B to 106B in FIG. 20. The penetrating separation portion 5, the dummy penetrating separation portion 5*b*, the penetrating wiring portion 9, and the dummy penetrating wiring portion 9*b* are formed in the middle wafer 1WC, similar to the uppermost wafer 1WA. The middle wafer 1WC is different from the uppermost wafer 1WA in that the bump base conductor pattern 25, the bump 26, and the dummy bump 26*b* are formed on a main surface of the middle wafer 1WC.

In addition, the middle wafer 1WC in this stage is still thick because the first to third thinning processings have not been performed.

Then, in the same manner as described in FIGS. 17 and 18, two wafers 1WA and 1WC are laminated together (laminating process of upper and lower wafers of third and subsequent layers in FIG. 20). At is time, since the middle wafer 1WC is still thick, the wafer 1WC can be handled stably and easily.

Then, the middle wafer 1WC at the lower side is made thin from the bottom surface side by the same thinning processing described in FIGS. 13 and 14 in a state where the glass support substrate 21 is laminated to the main surface of the uppermost wafer 1WA (process 107A for the middle in FIG. 20). As a result, the penetrating separation portion 5, the dummy penetrating separation portion 5*b*, the penetrating wiring portion 9, and the dummy penetrating wiring portion 9*b* are exposed from (protrude from) the bottom surface (lamination surface 30*a*) of the middle wafer 1WC at the lower side. Since the process of making the middle wafer 1WC thin is performed in a state where the two wafers 1WA and 1WC are laminated together, the mechanical strength of the wafer 1WC at the time of thinning processing can be secured and the stability in handling the wafer 1WC can be improved.

Then, the middle wafer 1WC and the lowermost wafer 1WB are laminated together by overlapping the middle wafer 1WC and the lowermost wafer 1WB with each other and injecting the adhesive 30 between the wafers 1WC and 1WB in a state where the glass support substrate 21 is laminated to the main surface of the uppermost wafer 1WA, in the same manner as described in FIGS. 17 and 18 (processes 201 to 203 of a middle lower portion in FIG. 20). Since the subsequent processes are the same as those described above, an explanation thereof will be omitted. In the case of laminating four or more layers together, the process performed for the middle wafer 1WC and the wafer laminating process are preferably performed repeatedly.

In the semiconductor device shown in FIG. 21, the end 9*c* of the penetrating wiring portion 9 and the bump 26 facing the end 9*c* of the penetrating wiring portion 9 are protruding connection portions that are formed to protrude from the lamination surfaces 30*a* and 30*b*, respectively. In addition, in an area where the penetrating wiring portion 9 (bump 26) is not disposed on the lamination surface 30*a* (30*b*), the dummy penetrating wiring portion 9*b* (dummy bump 26*b*) which is insulated from the semiconductor circuit and which protrudes from the lamination surface 30*a* (30*b*) to have the same height as the penetrating wiring portion 9 (bump 26) is formed, and the dummy penetrating separation portion 5*b* which protrudes from the lamination surface 30*a* to be higher than the penetrating wiring portion 9 is formed. Accordingly, since the load applied to the penetrating wiring portion 9 and the bump 26 is also applied to the dummy penetrating wiring portion 9*b*, the dummy penetrating separation portion 5*b*, and the dummy bump 26*b* when laminating the wafers 1WA, 1WB, and 1WC together, the variation in load applied to the penetrating wiring portion 9 and the bump 26 is reduced. As a result, damage to the penetrating wiring portion 9 and the bump 26 occurring when laminating the wafers 1WA, 1WB, and 1WC together can be effectively prevented. Thus, a semiconductor device which has excellent reliability and stable performance can be realized.

In addition, although the dummy bumps 26*b* are formed at all positions facing the dummy penetrating wiring portions 9*b* in the semiconductor device shown in FIG. 19 or the semiconductor device shown in FIG. 21, the dummy bump 26*b* may not be formed or the dummy bump 26*b* may be formed at only some of the positions facing the dummy penetrating wiring portion 9*b*. In addition, forming the dummy bump 26*b* may be suitably determined in consideration of the arrangement of the penetrating wiring portions 9 or the penetrating separation portions 5, conditions such as load at the time of laminating, the influence on the overall manufacturing process, and the like.

Figure 22:
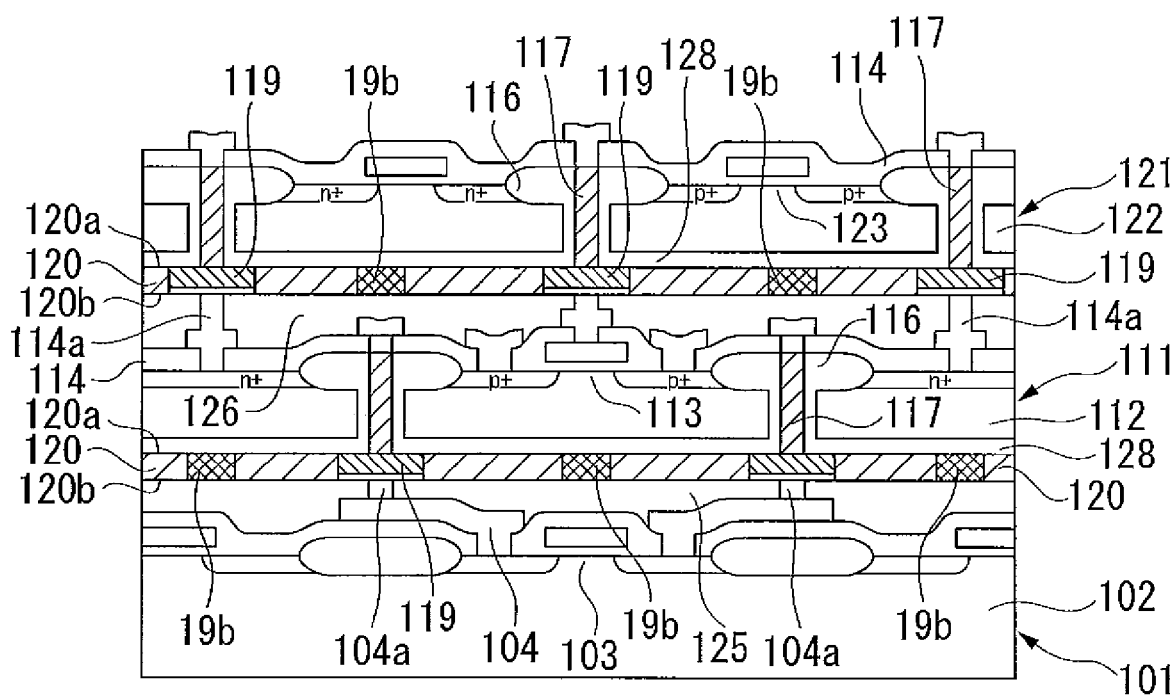
FIG. 22 is a cross-sectional view illustrating the main parts in still another example of the semiconductor device of the invention.

FIG. 22 is a cross-sectional view illustrating the main parts in still another example of the semiconductor device of the invention. FIGS. 23A to 23E are views illustrating a manufacturing process of the semiconductor device shown in FIG. 22.

The semiconductor device shown in FIG. 22 has a first wafer (lowermost wafer) 101, a second wafer (middle wafer) 111, and a third wafer (uppermost wafer) 121 which are laminated to each other.

On a lamination surface 120*a* of the third wafer 121 facing the second wafer 111 and a lamination surface 120*a* of the second wafer 111 facing the first wafer 101, electric signal connecting portions which are bumps 119 formed at end surfaces of penetrating wiring portions 117 are provided. In addition, on a lamination surface 120*b* of the second wafer 111 facing the third wafer 121 and a lamination surface 120*b* of the first wafer 101 facing the second wafer 111, electric signal connecting portions including end surfaces of contact plugs 104*a* and 114*a* are provided.

The penetrating wiring portion 117 formed in the second wafer 111 is formed to pass through a substrate 112, which forms the second wafer 111, and makes main and bottom surfaces of the second wafer 111 electrically conductive. In addition, the penetrating wiring portion 117 formed in the third wafer 121 is formed to pass through a substrate 122, which forms the third wafer 121, and makes main and bottom surfaces of the third wafer 121 electrically conductive.

Moreover, in the semiconductor device shown in FIG. 22, the bump 119 formed on the end surface of the penetrating wiring portion 117 of the second wafer 111 and the contact plug 104a of the first wafer 101 disposed to face each other are electrically connected to each other, and the bump 119 formed on the end surface of the penetrating wiring portion 117 of the third wafer 121 and the contact plug 114a of the second wafer 111 disposed to face each other are electrically connected to each other. As a result, a desired semiconductor circuit including MOSFETs 103, 113, and 123 provided in the substrates 102, 112, and 122 that form the wafers 101, 111, and 121 is formed.

In addition, as shown in FIG. 22, an insulating adhesive 120 is injected into a gap between the lamination surfaces 120a and 120b of the upper and lower opposite wafers. By the adhesive 120, the mechanical strength between the upper and lower wafers is secured.

In addition, in the semiconductor device shown in FIG. 22, the bump 119 which is an electric signal connecting portion is a protruding connection portion that is formed to protrude from the downward lamination surfaces 120a of the second wafer 111 and third wafer 121. As shown in FIG. 22, the bumps 119 are electrically connected to the MOSFETs 103, 113, and 123, which form the semiconductor circuit, through the penetrating wiring portion 117.

Moreover, a dummy bump 19b which is a reinforcing protruding portion protruding from the lamination surface 120a to have the same height as the bump 119 is formed in an area where the bump 119 is not disposed on the lamination surface 120a formed with the bumps 119 of the second wafer 111 and third wafer 121. In the semiconductor device shown in FIG. 22, the dummy bump 19b is formed to have the same height as the bump 119, which is a protruding connection portion, using the same material as the bump 119. In addition, as shown in FIG. 22, the dummy bump 19b is insulated from the semiconductor circuit by an insulating layer 128 so that the dummy bump 19b is not electrically connected to the penetrating wiring portion 117. In addition, the dummy bumps 19b are disposed to face insulating layers 125 and 126 of the laminated wafers so that the dummy bumps 19b are not electrically connected to the semiconductor circuits of the laminated wafers.

In the present embodiment, although the planar arrangement of the dummy bump 19b serving as a reinforcing protruding portion and the bump 119 serving as a protruding connection portion is not particularly limited, the same arrangement as the reinforcing protruding portion 52 and the protruding connection portion 51a shown in FIGS. 2A to 2D, for example, is preferable similar to the above-described embodiment.

The wafers 101, 111, and 121 respectively have: the MOSFETs 103, 113, and 123 which are elements that form a semiconductor circuit; a field oxide layer 116 formed of a silicon oxide or the like; wiring lines 114 and 104 formed of a metal, such as tungsten (W), aluminum (Al), or copper (Cu); contact plugs 104a and 114a; a penetrating wiring portion 117; and the insulating layers 125, 126, and 128 formed of a silicon oxide or the like, which are formed on the substrates 102, 112, and 122.

Next, a manufacturing process of the semiconductor device shown in FIG. 22 will be described with reference to FIGS. 23A to 23E.

First, the wafers 101, 111, and 121 are formed by forming the MOSFETS 103, 113, and 123, the field oxide layer 116, the wiring lines 114, 104, the penetrating wiring portion 117, and the insulating layer 128 in the substrates 102, 112, and 122 using a normal method of forming a semiconductor device. Moreover, in the first wafer 101, the contact plug 104a and the insulating layer 128 are also formed.

Figure 23A:
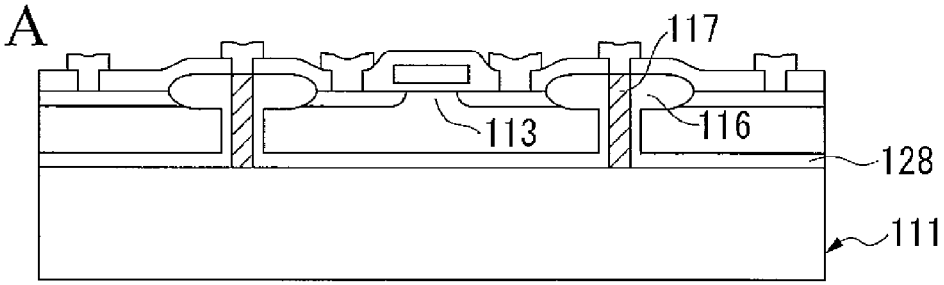
FIGS. 23A to 23E are views illustrating a manufacturing process of the semiconductor device shown in FIG. 22.
Figure 23B:
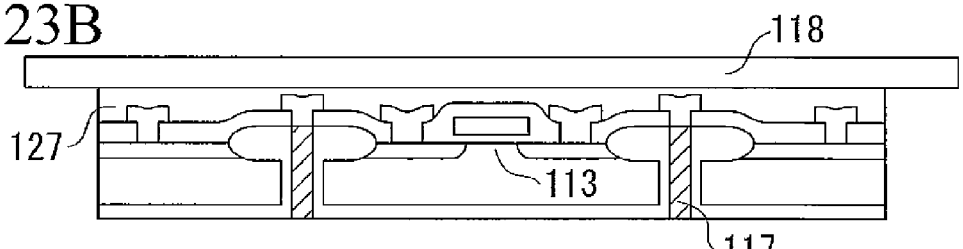

Then, a glass supporting substrate 118 is laminated on a main surface (upper surface in FIG. 23A) of the second wafer 111 shown in FIG. 23A with an adhesive sheet 127. Then, as shown in FIG. 23B, for example, thinning processing (grinding) related to the mechanical element and thinning processing (polishing) related to the mechanical element and the chemical element, such as CMP, are performed sequentially on the bottom surface (bottom surface in FIG. 23B) of the second wafer 111.

Figure 23C:
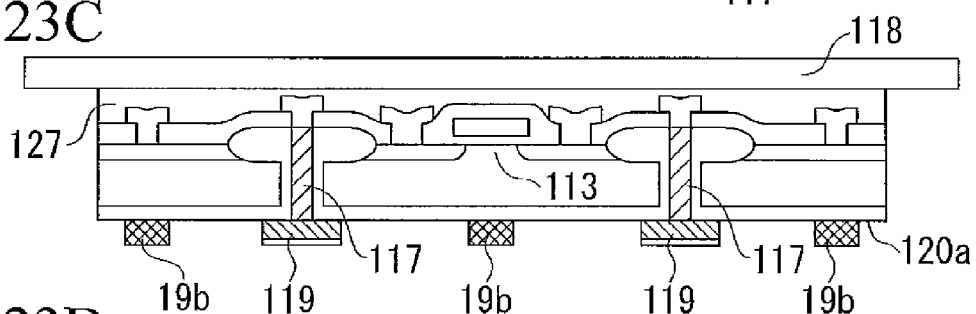

Then, as shown in FIG. 23C, the bump 119 is formed on the end surface of the penetrating wiring portion 117 exposed on the lamination surface 120a of the second wafer 111 and the dummy bump 19b is formed in an area where the penetrating wiring portion 117 is not disposed on the lamination surface 120a using a lift-off method, an electrolytic plating method, a printing method, or a ball dropping method, for example. As a result, the bump 119 and the dummy bump 19b are formed in the state of protruding from the downward lamination surface 120a of the second wafer 111.

Figure 23D:
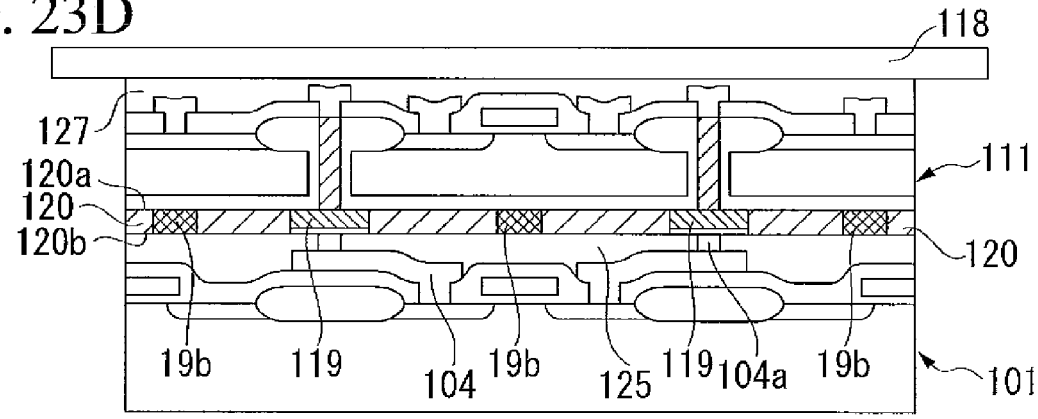

Then, as shown in FIG. 23D, the lamination surface 120a of the second wafer 111 is disposed on the lamination surface 120b of the first wafer 101 so as to face the lamination surface 120b of the first wafer 101. Then, relative positioning between the first wafer 101 and the second wafer 111 is performed. Specifically, positioning between the contact plug 104a of the first wafer 101 and the bump 119 of the second wafer 111 corresponding to the contact plug 104a is performed.

Then, the contact plug 104a of the first wafer 101 and the bump 119 of the second wafer 111 are brought into contact with each other to be electrically connected. As a result, semiconductor circuit portions of the first and second wafers 101 and 111 are electrically connected to each other.

Then, the insulating adhesive 120 is injected into a gap between the opposite lamination surfaces 120a and 120b of the first and second wafers 101 and 111.

Figure 23E:
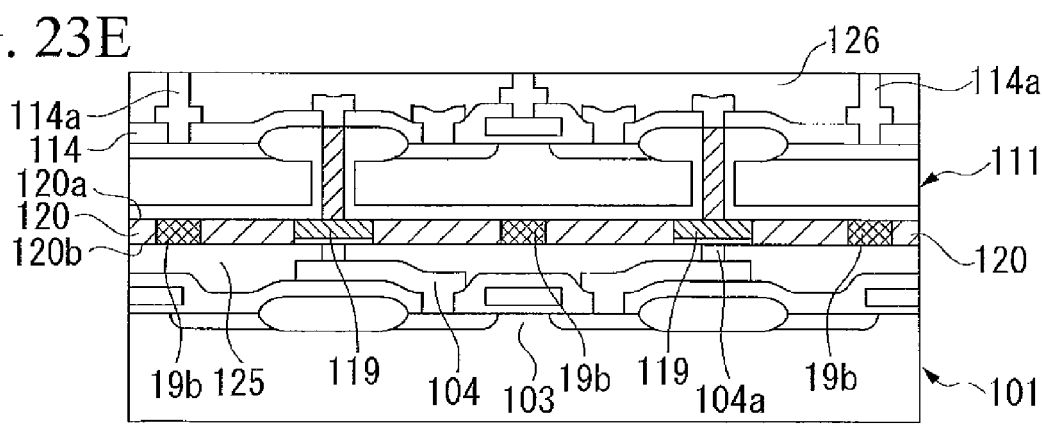

Subsequently, as shown in FIG. 23E, the glass supporting substrate 118 is peeled off from the second wafer 111, the interlayer insulating layer 126 is formed on the main surface of the second wafer 111, and the contact plug 114a passing through the interlayer insulating layer 126 is formed.

Then, similar to laminating between the first wafer 101 and the second wafer 111, the third wafer 121 is disposed on the second wafer 111, the contact plug 114a of the second wafer 111 and the bump 119 of the third wafer 121 are brought into contact with each other to be electrically connected, and the insulating adhesive 120 is injected into a gap between the lamination surfaces 120a and 120b. This is the semiconductor device shown in FIG. 22.

In the semiconductor device shown in FIG. 22, the wafers 101, 111, and 121 are laminated together. Electric signal connecting portions formed by the bumps 119 are provided on the lamination surfaces 120a of the upper wafers 111 and 121 facing the lower wafers 101 and 111, and electric signal connecting portions formed by the contact plugs 104a and 114a are provided on the lamination surfaces 120b of the lower wafers 101 and 111 facing the upper wafers 111 and 121. The desired semiconductor circuit is formed by electrically connecting the bumps 119 of the upper wafers with the contact plugs 104a and 114a of the lower wafers. Moreover, in the semiconductor device shown in FIG. 22, the bumps 119 of the upper wafers 111 and 121 are protruding connection portions that are formed to protrude from the lamination surfaces 120a. In addition, the dummy bump 19b which is insulated from the semiconductor circuit and which protrudes from the lamination surface 120a to have the same height as the bump 119 is formed in an area where the bump 119 is not disposed on the lamination surface 120a. Accordingly, since the load applied to the bump 119 is also applied to the dummy bump 19b when laminating the wafers 101, 111, and 121 together, a variation in load applied to the bump 119 is reduced. As a result, damage to the bump 119 occurring when laminating the wafers 101, 111, and 121 together can be effectively prevented. Thus, the semiconductor device which has excellent reliability and stable performance can be realized.

Furthermore, since the dummy bump 19b is formed to have the same shape as the bump 119 using the same material as the bump 119 in the semiconductor device shown in FIG. 22, the dummy bump 19b and the bump 119 can be formed simultaneously. Accordingly, the dummy bump 19b and the bump 119 can be easily manufactured.

In addition, a method of manufacturing the semiconductor device shown in FIG. 22 includes: a process of forming the bumps 119, which protrude from the lamination surfaces 120a, on the lamination surfaces 120a of the upper wafers 111 and 121; a process of forming the dummy bump 19b, which is insulated from a semiconductor circuit and protrudes from the lamination surface 120a to have the same height as the bump 119, in an area where the bump 119 is not disposed on the lamination surface 120a formed with the bump 119; and a process of forming a desired semiconductor circuit by laminating the wafers 101, 111, and 121 together and electrically connecting the contact plugs 104a and 114a and the bump 119, which are electric signal connecting portions, with each other. Accordingly, the load applied to the bump 119 is also applied to the dummy bump 19b when laminating the wafers 101, 111, and 121 together. As a result, the variation in load applied to the bump 119 is reduced.

Moreover, in the method of manufacturing the semiconductor device shown in FIG. 22, a process of forming the bump 119 and a process of forming the dummy bump 19b are simultaneously performed. Therefore, the bump 119 and the dummy bump 19b can be efficiently manufactured compared with the case where the bump 119 and the dummy bump 19b are separately formed.

Furthermore, in the method of manufacturing the semiconductor device shown in FIG. 22, the process of forming the bump 119 and the process of forming the dummy bump 19b include a process of forming the bumps 119 on the end surfaces of the penetrating wiring portions 117 exposed on the lamination surfaces 120a of the upper wafers 111 and 121 and forming the dummy bump 19b in an area where the penetrating wiring portions 117 are not disposed on the lamination surface 120b. Accordingly, since the dummy bump 19b can be formed without increasing the number of processes, manufacturing can be efficiently performed compared with the case where the dummy bump 19b is not formed.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device having a plurality of wafers which are laminated to each other, wherein:
    each wafer comprises an lamination surface to which another wafer is directly laminated;
    the lamination surface of each wafer is provided with an electric signal connecting portion that electrically connects to each other so as to form a semiconductor circuit;
    at least one of the electrical signal connecting portions facing each other is a protruding connection portion that protrudes from the lamination surface of the wafer having the protruding connection portion; and
    a reinforcing protruding portion that is insulated from the semiconductor circuit and is provided in an area where the protruding connection portion is not disposed on the lamination surface formed with the protruding connection portion so as to protrude therefrom with a height equal to or larger than that of the protruding connection portion.

2. The semiconductor device according to claim 1, wherein a plurality of the reinforcing protruding portions is disposed on each wafer so as to surround the one protruding connection portion.

3. A method of manufacturing the semiconductor device according to claim 2, comprising:
    forming the protruding connection portion which protrudes from the lamination surface of the wafer having the protruding connection portion;
    forming a reinforcing protruding portion, which is insulated from the semiconductor circuit and protrudes from the lamination surface of the wafer having the protruding connection portion with a height equal to or larger than that of the protruding connection portion, in an area where the protruding connection portion is not disposed on the lamination surface formed with the protruding connection portion; and
    forming the semiconductor circuit by laminating the plurality of wafers together and electrically connecting the protruding connection portion of each wafer with an electric signal connecting portion, which is provided on a lamination surface of another wafer facing each wafer so as to face the protruding connection portion.

4. The semiconductor device according to claim 1, wherein a plurality of protruding connection portions are disposed adjacent to each other to thereby form a protruding connection portion group, and
    a plurality of the reinforcing protruding portions is disposed so as to surround the protruding connection portion group.

5. A method of manufacturing the semiconductor device according to claim 4, comprising:
    forming the protruding connection portion which protrudes from the lamination surface of the wafer having the protruding connection portion;
    forming a reinforcing protruding portion, which is insulated from the semiconductor circuit and protrudes from the lamination surface of the wafer having the protruding connection portion with a height equal to or larger than that of the protruding connection portion, in an area where the protruding connection portion is not disposed on the lamination surface formed with the protruding connection portion; and
    forming the semiconductor circuit by laminating the plurality of wafers together and electrically connecting the protruding connection portion of each wafer with an electric signal connecting portion, which is provided on a lamination surface of another wafer facing each wafer so as to face the protruding connection portion.

6. The semiconductor device according to claim 1, wherein a plurality of protruding connection portions are disposed adjacent to each other to thereby form two or more protruding connection portion groups, and a plurality of the reinforcing protruding portions is disposed so as to surround the two or more protruding connection portion groups formed adjacent to each other.

7. A method of manufacturing the semiconductor device according to claim 6, comprising:
   forming the protruding connection portion which protrudes from the lamination surface of the wafer having the protruding connection portion;
   forming a reinforcing protruding portion, which is insulated from the semiconductor circuit and protrudes from the lamination surface of the wafer having the protruding connection portion with a height equal to or larger than that of the protruding connection portion, in an area where the protruding connection portion is not disposed on the lamination surface formed with the protruding connection portion; and
   forming the semiconductor circuit by laminating the plurality of wafers together and electrically connecting the protruding connection portion of each wafer with an electric signal connecting portion, which is provided on a lamination surface of another wafer facing each wafer so as to face the protruding connection portion.

8. The semiconductor device according to claim 1, wherein the reinforcing protruding portion is formed to have the same shape as the protruding connection portion and is formed of the same material as that of the protruding connection portion.

9. A method of manufacturing the semiconductor device according to claim 8, comprising:
   forming the protruding connection portion which protrudes from the lamination surface of the wafer having the protruding connection portion;
   forming a reinforcing protruding portion, which is insulated from the semiconductor circuit and protrudes from the lamination surface of the wafer having the protruding connection portion with a height equal to or larger than that of the protruding connection portion, in an area where the protruding connection portion is not disposed on the lamination surface formed with the protruding connection portion; and
   forming the semiconductor circuit by laminating the plurality of wafers together and electrically connecting the protruding connection portion of each wafer with an electric signal connecting portion, which is provided on a lamination surface of another wafer facing each wafer so as to face the protruding connection portion.

10. The semiconductor device according to claim 1, wherein
   at least one of the electric signal connecting portions is an end of a penetrating wiring portion which makes respective directly contacting surfaces of the wafers electrically conductive.

11. A method of manufacturing the semiconductor device according to claim 10, comprising:
   forming the protruding connection portion which protrudes from the lamination surface of the wafer having the protruding connection portion;
   forming a reinforcing protruding portion, which is insulated from the semiconductor circuit and protrudes from the lamination surface of the wafer having the protruding connection portion with a height equal to or larger than that of the protruding connection portion, in an area where the protruding connection portion is not disposed on the lamination surface formed with the protruding connection portion; and
   forming the semiconductor circuit by laminating the plurality of wafers together and electrically connecting the protruding connection portion of each wafer with an electric signal connecting portion, which is provided on a lamination surface of another wafer facing each wafer so as to face the protruding connection portion.

12. The semiconductor device according to claim 1, wherein at least one of the protruding connection portions is a bump.

13. A method of manufacturing the semiconductor device according to claim 12, comprising:
   forming the protruding connection portion which protrudes from the lamination surface of the wafer having the protruding connection portion;
   forming a reinforcing protruding portion, which is insulated from the semiconductor circuit and protrudes from the lamination surface of the wafer having the protruding connection portion with a height equal to or larger than that of the protruding connection portion, in an area where the protruding connection portion is not disposed on the lamination surface formed with the protruding connection portion; and
   forming the semiconductor circuit by laminating the plurality of wafers together and electrically connecting the protruding connection portion of each wafer with an electric signal connecting portion, which is provided on a lamination surface of another wafer facing each wafer so as to face the protruding connection portion.

14. The semiconductor device according to claim 1, wherein
   a penetrating separation portion that is formed of an insulating layer with a frame shape in plan view of the lamination surface and surrounds the protruding connection portion on each wafer, and
   the reinforcing protruding portion is formed of the same material as the penetrating separation portion.

15. A method of manufacturing the semiconductor device according to claim 14, comprising:
   forming the protruding connection portion which protrudes from the lamination surface of the wafer having the protruding connection portion;
   forming a reinforcing protruding portion, which is insulated from the semiconductor circuit and protrudes from the lamination surface of the wafer having the protruding connection portion with a height equal to or larger than that of the protruding connection portion, in an area where the protruding connection portion is not disposed on the lamination surface formed with the protruding connection portion; and
   forming the semiconductor circuit by laminating the plurality of wafers together and electrically connecting the protruding connection portion of each wafer with an electric signal connecting portion, which is provided on a lamination surface of another wafer facing each wafer so as to face the protruding connection portion.

16. A method of manufacturing the semiconductor device according to claim 1, comprising:
   forming the protruding connection portion which protrudes from the lamination surface of the wafer having the protruding connection portion;
   forming a reinforcing protruding portion, which is insulated from the semiconductor circuit and protrudes from the lamination surface of the wafer having the protruding connection portion with a height equal to or larger than that of the protruding connection portion, in an area where the protruding connection portion is not disposed on the lamination surface formed with the protruding connection portion; and forming the semiconductor circuit by laminating the plurality of wafers together and electrically connecting the protruding connection portion of each wafer with an electric signal connecting portion, which is provided on a lamination surface of another wafer facing each wafer so as to face the protruding connection portion.

17. The method of manufacturing the semiconductor device according to claim 16, wherein the forming of the protruding connection portion and the forming of the reinforcing protruding portion are simultaneously performed.

18. The method of manufacturing the semiconductor device according to claim 17, wherein forming of the protruding connection portion and the forming of the reinforcing protruding portion include:

forming conductive portions, which become the protruding connection portion and the reinforcing protruding portion, by forming a groove in one surface of the wafer and embedding a conductive layer in the groove;

forming an insulating layer for insulating a conductive portion which becomes the reinforcing protruding portion on the one surface;

forming a wiring line electrically connected to a conductive portion which becomes the protruding connection portion; and forming the protruding connection portion and the reinforcing protruding portion protruding from the lamination surface of the wafer having the protruding connection portion by exposing a part of the conductive portions, which become the protruding connection portion and the reinforcing protruding portion, from the other surface of the wafer.

19. The method of manufacturing the semiconductor device according to claim 17, wherein the forming of the protruding connection portion and the forming of the reinforcing protruding portion include:

forming a bump which is the protruding connection portion on a wiring line exposed on the lamination surface, and forming a dummy bump which is the reinforcing protruding portion in an area where the wiring line is not disposed on the lamination surface.

* * * * *